(12) United States Patent
Ka et al.

(10) Patent No.: US 11,355,568 B2
(45) Date of Patent: Jun. 7, 2022

(54) ORGANIC LIGHT EMITTING DIODE DISPLAY DEVICE

(71) Applicant: SAMSUNG DISPLAY CO., LTD., Yongin-si (KR)

(72) Inventors: Ji-Hyun Ka, Seongnam-si (KR); Taegeun Kim, Seoul (KR); Ki Myeong Eom, Suwon-si (KR); Kwangsae Lee, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 339 days.

(21) Appl. No.: 16/542,850

(22) Filed: Aug. 16, 2019

(65) Prior Publication Data
US 2020/0058725 A1    Feb. 20, 2020

(30) Foreign Application Priority Data

Aug. 20, 2018 (KR) .......................... 10-2018-0096654

(51) Int. Cl.
| | |
|---|---|
| *H01L 27/32* | (2006.01) |
| *H01L 27/12* | (2006.01) |
| *H01L 21/44* | (2006.01) |
| *H01L 29/786* | (2006.01) |
| *H01L 29/423* | (2006.01) |
| *H01L 29/417* | (2006.01) |

(52) U.S. Cl.
CPC .......... *H01L 27/3262* (2013.01); *H01L 21/44* (2013.01); *H01L 27/1225* (2013.01); *H01L 29/41733* (2013.01); *H01L 29/42356* (2013.01); *H01L 29/7869* (2013.01); *H01L 29/78618* (2013.01)

(58) Field of Classification Search
CPC combination set(s) only.
See application file for complete search history.

(56) References Cited

U.S. PATENT DOCUMENTS

| | | | |
|---|---|---|---|
| 9,740,040 B2 | 8/2017 | Park et al. | |
| 10,050,091 B2 | 8/2018 | Lee et al. | |
| 10,134,877 B2 | 11/2018 | Hong et al. | |
| 2011/0134018 A1* | 6/2011 | Seo | H01L 51/003 345/76 |
| 2014/0117320 A1* | 5/2014 | Jung | H01L 27/3276 257/40 |
| 2015/0008404 A1* | 1/2015 | Oh | H01L 51/5096 257/40 |

* cited by examiner

*Primary Examiner* — Matthew G Landau
*Assistant Examiner* — Dmitriy Yemelyanov
(74) *Attorney, Agent, or Firm* — Kile Park Reed & Houtteman PLLC

(57) ABSTRACT

An organic light emitting diode ("OLED") display device includes a substrate having a display region including a light emitting region and a peripheral region, and a pad region located in one side of the display region, a plurality of light emitting structures on the substrate in the light emitting region, and a plurality of fan-out wirings including a low fan-out wiring in the peripheral region on the substrate, a middle fan-out wiring on the low fan-out wiring, the middle fan-out wiring overlapping at least a portion of the low fan-out wiring, and an upper fan-out wiring on the middle fan-out wiring, the upper fan-out wiring overlapping at least a portion of the low fan-out wiring.

24 Claims, 22 Drawing Sheets

ORGANIC LIGHT EMITTING DIODE DISPLAY DEVICE

CROSS-REFERENCE TO RELATED APPLICATION

Korean Patent Applications No. 10-2018-0096654, filed on Aug. 20, 2018 in the Korean Intellectual Property Office (KIPO), and entitled: "Organic Light Emitting Diode Display Device," is incorporated by reference herein in its entirety.

BACKGROUND

1. Field

Example embodiments relate to an organic light emitting diode display device including a plurality of fan-out wirings.

2. Description of the Related Art

A flat panel display ("FPD") device is widely used as a display device of an electronic device because the FPD device is lightweight and thin compared to a cathode-ray tube ("CRT") display device. Typical examples of the FPD device are a liquid crystal display ("LCD") device and an organic light emitting diode ("OLED") display device.

SUMMARY

An organic light emitting diode ("OLED") display device includes a substrate having a display region including a light emitting region and a peripheral region, and a pad region located in one side of the display region, a plurality of light emitting structures on the substrate in the light emitting region, and a plurality of fan-out wirings including a low fan-out wiring in the peripheral region on the substrate, a middle fan-out wiring on the low fan-out wiring, the middle fan-out wiring overlapping at least a portion of the low fan-out wiring, and an upper fan-out wiring on the middle fan-out wiring, the upper fan-out wiring overlapping at least a portion of the low fan-out wiring.

The substrate may include a first organic film layer, a first barrier layer on the first organic film layer, a second organic film layer on the first barrier layer, and a second barrier layer on the second organic film layer.

The low fan-out wiring may directly contact the second barrier layer.

The fan-out wirings may be in a portion of the peripheral region between the light emitting region and the pad region.

Each of the fan-out wirings may include a straight line portion and an oblique line portion.

The straight line portion of each of the fan-out wirings may extend in a first direction from the pad region into the display region. The oblique line portion of each of the fan-out wirings may extend in a direction that is different from the first direction.

The straight line portion and the oblique line portion may be integrally formed.

The oblique line portion may have a first distal end connected to the straight line portion and a second distal end aligned in one side of the light emitting region.

The low, middle, and upper fan-out wirings may be located at different layers from each other.

A first side portion of the low fan-out wiring may overlap the middle fan-out wiring. A second side portion of the low fan-out wiring may overlap the upper fan-out wiring. The first side portion may be opposite to the second side portion.

The OLED display device may further include a power supply wiring on the fan-out wirings.

The fan-out wirings may include first through (N)th fan-out wirings, where N is a multiple of 4. A (4K+1)th fan-out wiring among the first through (N)th fan-out wirings may correspond to a middle fan-out wiring. (4K+2)th and (4K+4)th fan-out wirings among the first through (N)th fan-out wirings may correspond to the low fan-out wirings. A (4K+3)th fan-out wiring among the first through (N)th fan-out wirings may correspond to the upper fan-out wiring, where K is an integer between 0 and (N/4)−1. The (4K+1)th fan-out wiring may overlap a first side portion of the (4K+2)th fan-out wiring. The (4K+3)th fan-out wiring may overlap a second side portion of the (4K+2)th fan-out wiring and a first side portion of the (4K+4)th fan-out wiring.

The pad region may include a bending region adjacent to the display region and a pad electrode region spaced apart from the display region.

The OLED display device may further include a plurality of pad electrodes in the pad electrode region, the pad electrodes being electrically connected to an external device, and connection electrodes in the bending region, the connection electrodes electrically connecting the fan-out wirings and the pad electrodes.

The OLED display device may further include a buffer layer on the substrate, the buffer layer covering the low fan-out wiring in the peripheral region, and a plurality of semiconductor elements between the buffer layer and the light emitting structures.

Each of the semiconductor elements may include an active layer on the buffer layer, a gate insulation layer covering the active layer on the buffer layer, a first gate electrode on the gate insulation layer, a first insulating interlayer covering the first gate electrode and the middle fan-out wiring on the gate insulation layer, a second gate electrode on the first insulating interlayer, a second insulating interlayer covering the second gate electrode and the upper fan-out wiring on the first insulating interlayer, and source and drain electrodes on the second insulating interlayer.

The OLED display device may further include a thin film encapsulation structure on the light emitting structures. Each of the light emitting structures may include a lower electrode a light emitting layer on the lower electrode, and an upper electrode on the light emitting layer. The thin film encapsulation structure may include a first thin film encapsulation layer on the upper electrode, the first thin film encapsulation layer including inorganic materials having flexibility, a second thin film encapsulation layer on the first thin film encapsulation layer, the second thin film encapsulation layer including organic materials having the flexibility, and a third thin film encapsulation layer on the second thin film encapsulation layer, the third thin film encapsulation layer including the inorganic materials having flexibility.

Embodiments are also directed to an OLED display device including a substrate having a display region including a light emitting region and a peripheral region and a pad region located in one side of the display region, a buffer layer on the substrate, a plurality of light emitting structures in the light emitting region on the buffer layer, and a plurality of fan-out wirings on the substrate in a portion of the peripheral region between the light emitting region and the pad region, the fan-out wirings including a low fan-out wiring between the buffer layer and the substrate, a middle fan-out wiring on the low fan-out wiring, the middle fan-out wiring selectively overlapping at least a portion of the low fan-out wiring, and an upper fan-out wiring on the middle fan-out wiring, the upper fan-out wiring selectively overlapping at least a portion of the low fan-out wiring.

The substrate may include a first organic film layer, a first barrier layer disposed on the first organic film layer, a second organic film layer disposed on the first barrier layer, and a second barrier layer disposed on the second organic film layer.

Each of the fan-out wirings may include a straight line portion and an oblique line portion. The straight line portion of each of the fan-out wirings may extend in a first direction from the pad region into the display region. The oblique line portion of each of the fan-out wirings may extend in a direction that is different from the first direction. The middle, low, and upper fan-out wirings may be alternately disposed.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
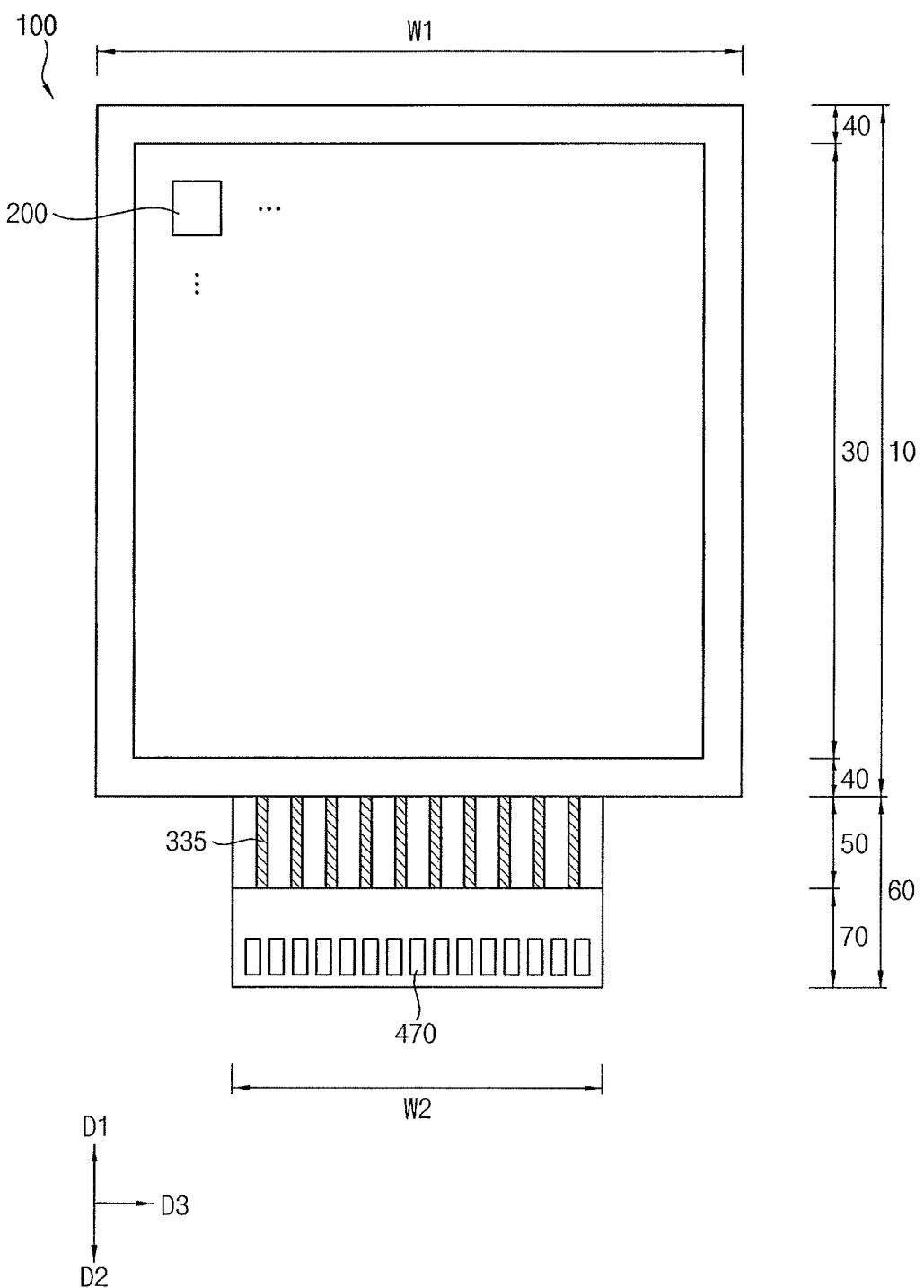
FIG. 1 illustrates a plan view of an organic light emitting diode ("OLED") display device in accordance with example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, embodiments of the present inventive concept will be explained in detail with reference to the accompanying drawings.

Figure 2:
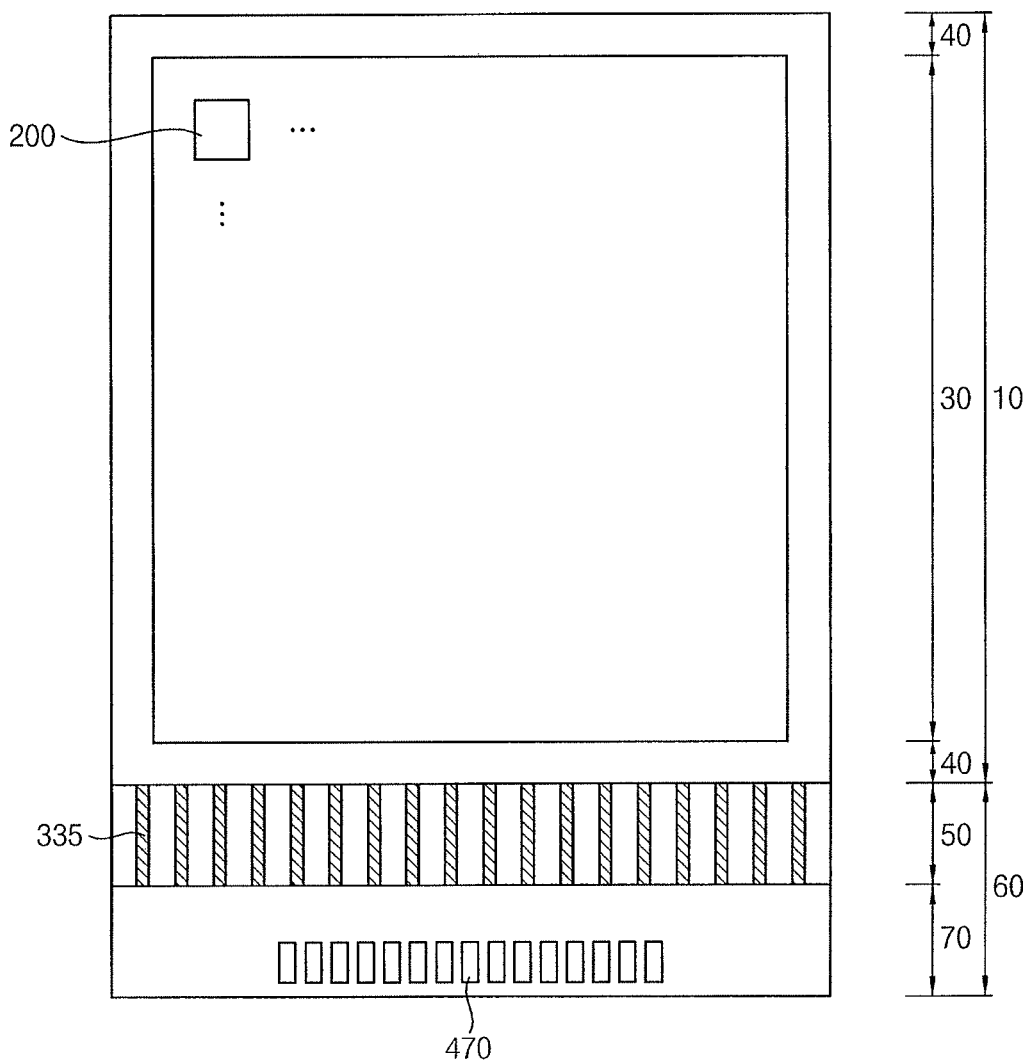
FIG. 2 illustrates a plan view of an example of the OLED display device.
Figure 3:
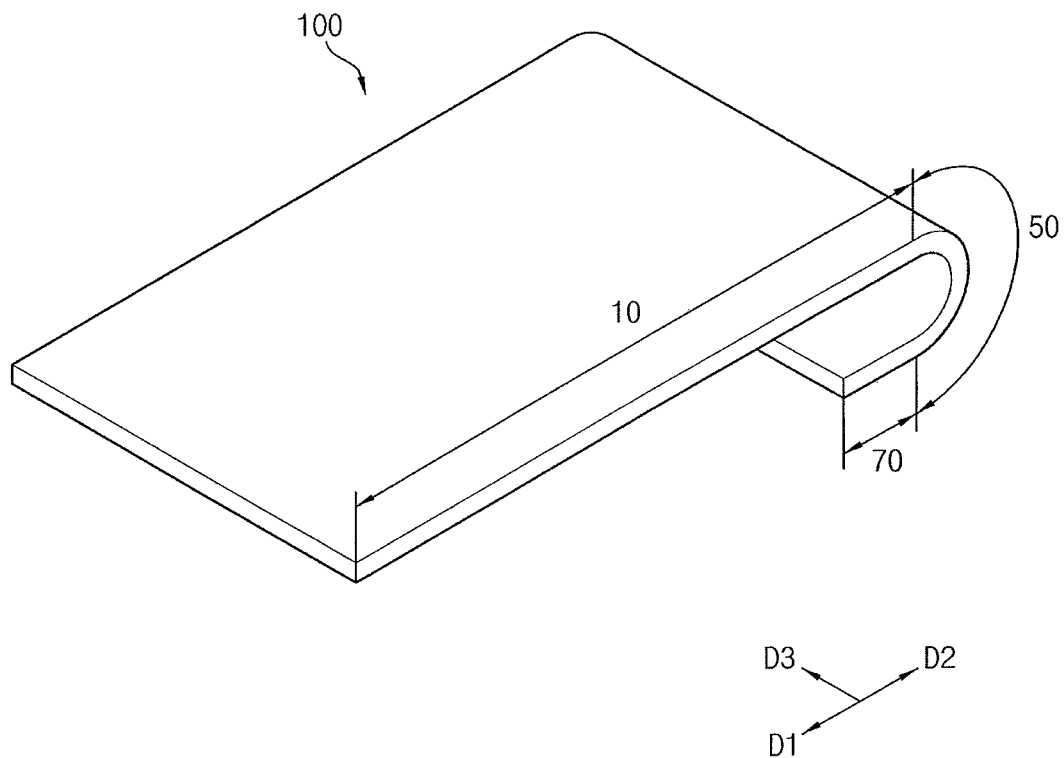
FIG. 3 illustrates a perspective view for describing a bent shape of the OLED display device of FIG. 1.
Figure 4:
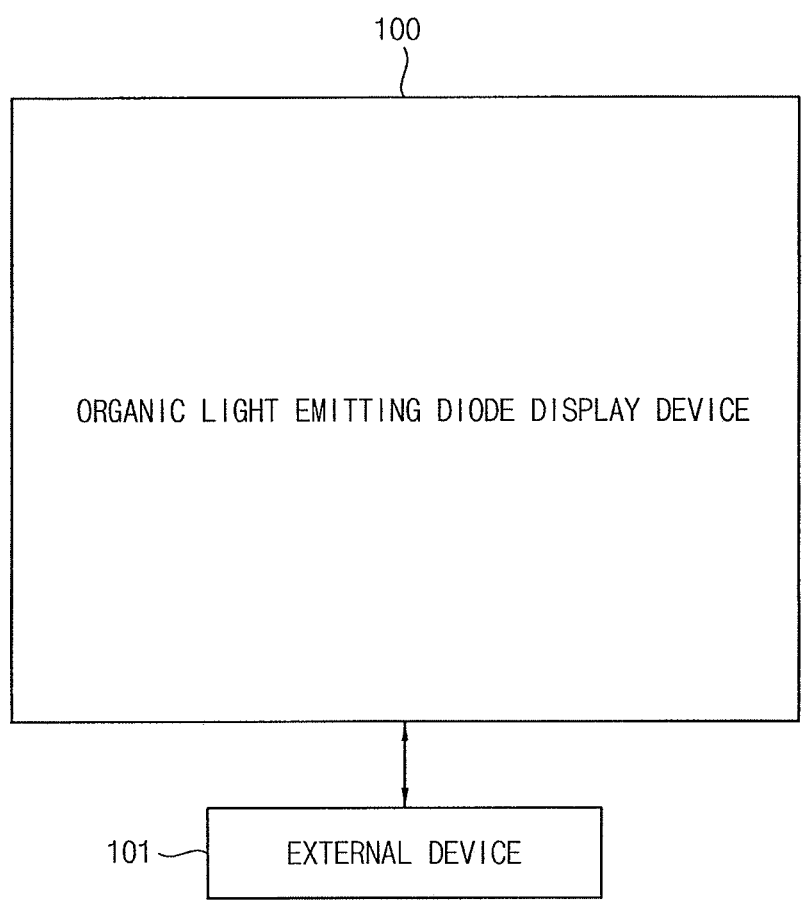
FIG. 4 illustrates a block diagram for describing an external device electrically connected to the OLED display device of FIG. 1.

FIG. 1 illustrates a plan view of an organic light emitting diode ("OLED") display device in accordance with example embodiments. FIG. 2 illustrates a plan view of an example of the OLED display device. FIG. 3 illustrates a perspective view for describing a bent shape of the OLED display device of FIG. 1. FIG. 4 illustrates a block diagram for describing an external device electrically connected to the OLED display device of FIG. 1.

Referring to FIGS. 1, 3, and 4, an OLED display device 100 may include a display region 10 and a pad region 60. A plurality of light emitting structures 200 may be disposed in the display region 10. The pad region 60 may be located in one side of the display region 10. The pad region 60 may include a bending region 50 and a pad electrode region 70. Pad electrodes 470 that are electrically connected to an external device 101 may be disposed in the pad electrode region 70. The bending region 50 may be located between the display region 10 and the pad electrode region 70. Connection electrodes 335 may be disposed in the bending region 50. In some example embodiments, a width of the pad region 60 may be less than a width of the display region 10. For example, in a plan view of the OLED display device 100, the display region 10 may have a first width W1 extending in a direction (e.g., a third direction D3) that is parallel to an upper surface of the OLED display device 100. The pad region 60 may have a second width W2 extending in the third direction D3. The second width W2 may be less than the first width W1. In some example embodiments, a width of the display region 10 may be identical to a width of the pad region 60, as illustrated in FIG. 2. In some implementations, the OLED display device 100 might not include the bending region 50. For example, the display region 10 may be located adjacent to the pad electrode region 70.

The display region 10 may include a light emitting region 30 and a peripheral region 40 surrounding the light emitting region 30. The light emitting structures 200 capable of emitting light may be disposed in the light emitting region 30. A plurality of wirings may be disposed in the peripheral region 40. In example embodiments, fan-out wirings and a wiring structure may be disposed in the peripheral region 40 (e.g., the peripheral region 40 of FIG. 8) located between the light emitting region 30 and the bending region 50 (or the pad region 60). The wirings and the fan-out wirings may electrically connect the pad electrodes 470 and the connection electrodes 335 to the light emitting structures 200. For example, the wirings and the fan-out wirings may include data signal wirings, gate signal wirings, light emission signal wirings, initialization signal wirings, power supply wirings, etc. In addition, a scan driver, a data driver, etc. may be disposed in the peripheral region 40.

In some example embodiments, the peripheral region 40 surrounding the light emitting region 30 may have a same width, as shown in FIG. 1. For example, the peripheral region 40 may include a first region extending in the third direction D3 and a second region extending in a first direction D1 or a second direction D2 that is perpendicular to the third direction D3. For example, the first region of the peripheral region 40 may be located adjacent to a top of the light emitting region 30 and the bending region 50, and the second region of the peripheral region 40 may be located in both lateral portions of the light emitting region 30 (e.g., left and right sides of the light emitting region 30). A width of the second region extending in the third direction D3 may be relatively less than a width of the second region extending in the first direction D1 (or the second direction D2). When the bending region 50 is bent, the pad electrode region 70 may become located on a lower surface of the OLED display device 100 (refer to FIG. 3). For example, when the pad electrode region 70 is located on the lower surface of the OLED display device 100, the bending region 50 may have a round shape (or a bended shape).

The external device 101 may be electrically connected to the OLED display device 100 through a flexible printed circuit board ("FPCB"). The external device 101 may provide a data signal, a gate signal, a light emission signal, an initialization signal, a power supply, etc., to the OLED display device 100. In addition, a driving integrated circuit may be mounted (e.g., installed) in the FPCB. In some example embodiments, the driving integrated circuit may be mounted in the OLED display device 100 so as to be located adjacent to the pad electrodes 470.

Figure 5:
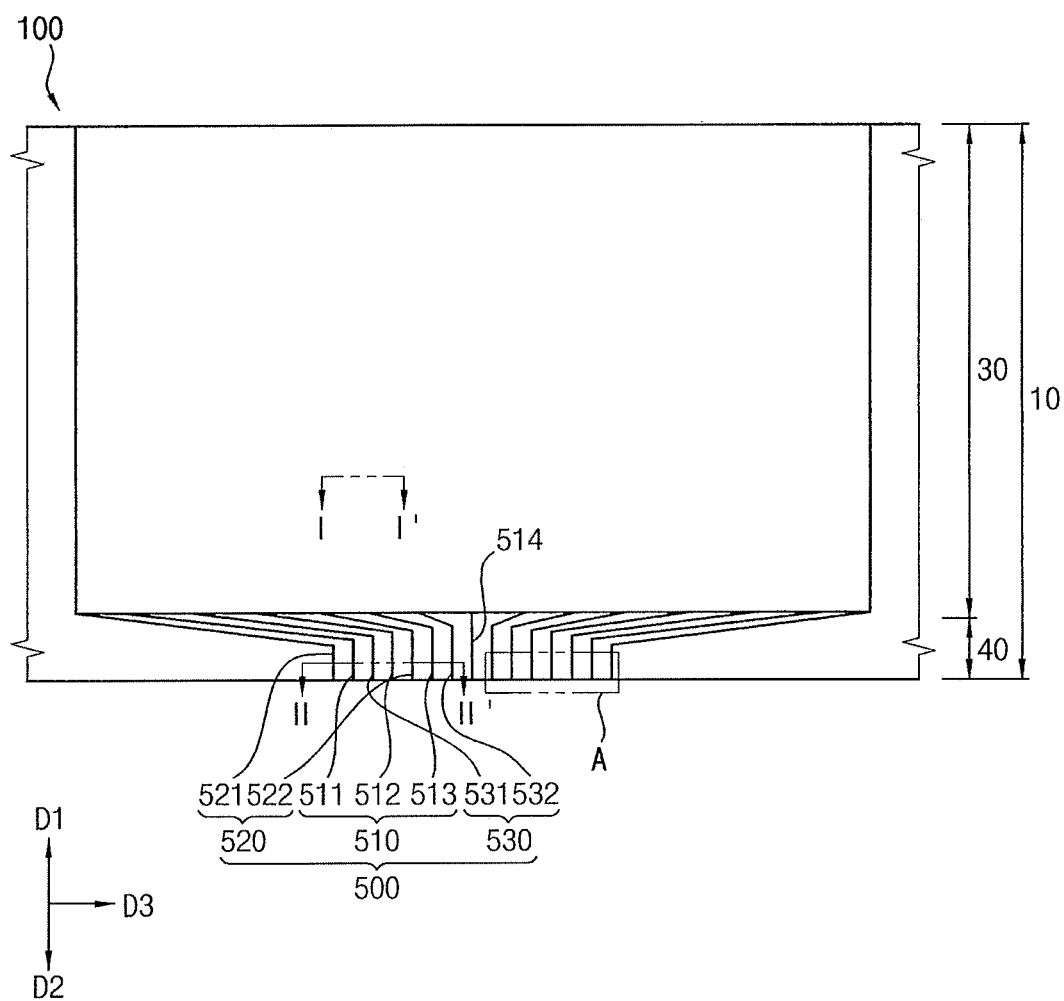
FIG. 5 illustrates a plan view for describing a fan-out wiring included in the OLED display device of FIG. 1.
Figure 6:
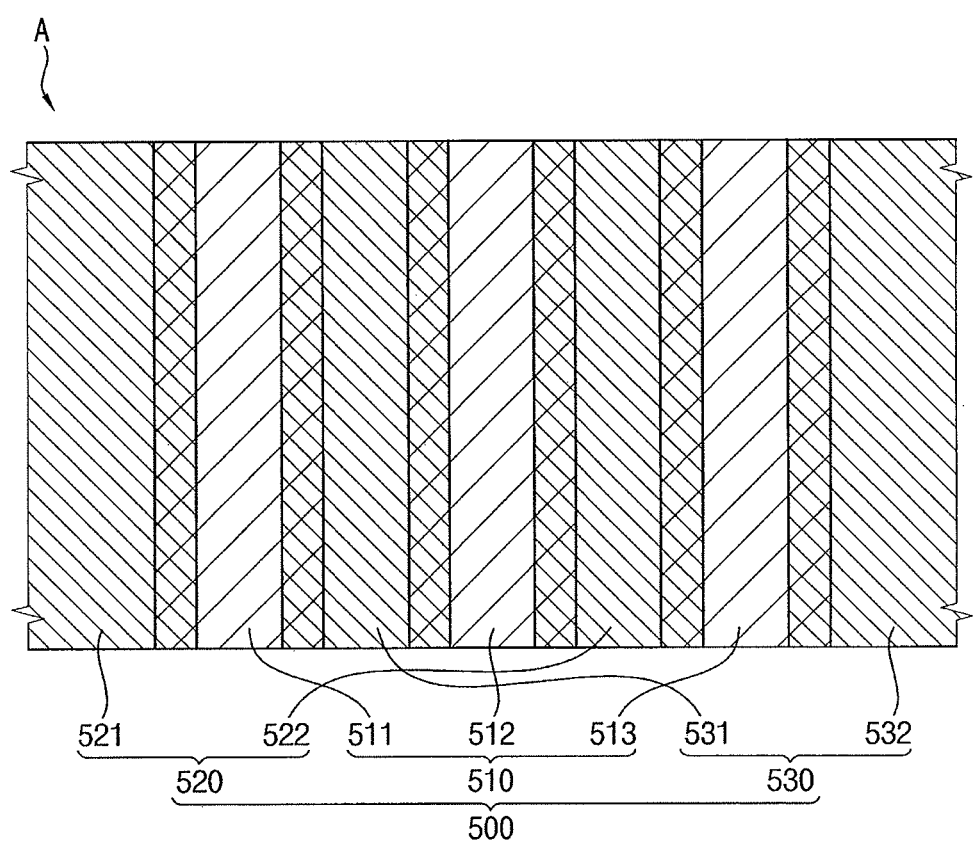
FIG. 6 illustrates an enlarged plan view corresponding to region 'A' of FIG. 5.
Figure 6:
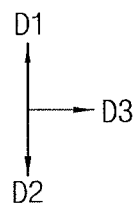
Figure 7:
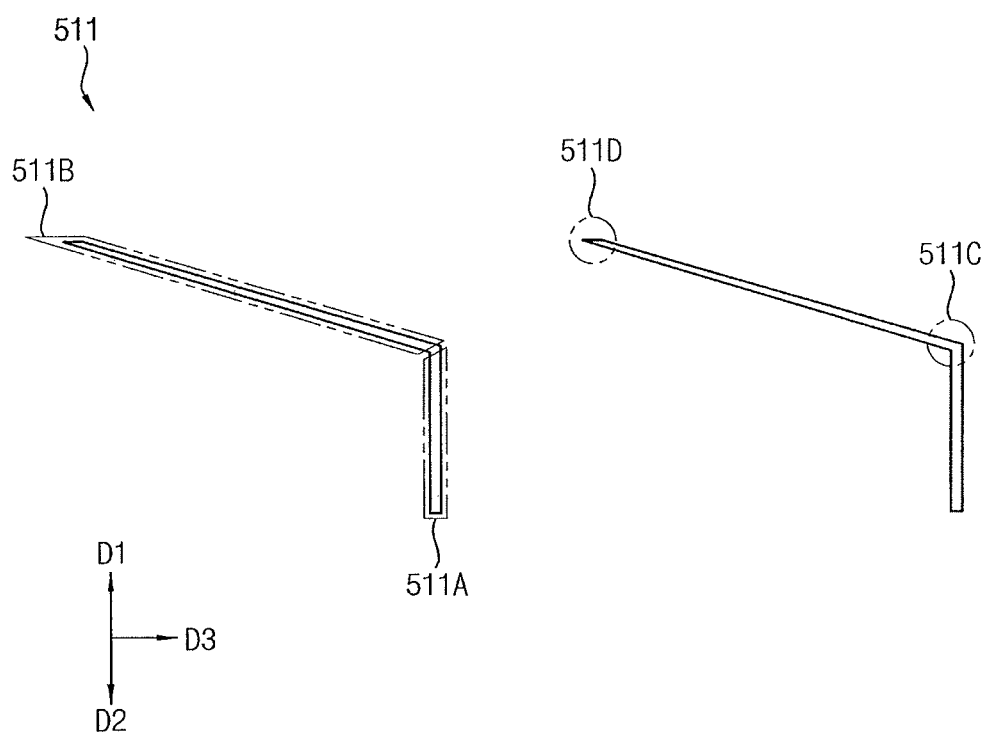
FIG. 7 illustrates a plan view for describing a fan-out wiring included in the OLED display device of FIG. 6.

FIG. 5 illustrates a plan view for describing a fan-out wiring included in the OLED display device of FIG. 1. FIG. 6 illustrates an enlarged plan view corresponding to region 'A' of FIG. 5. FIG. 7 illustrates a plan view for describing a fan-out wiring included in the OLED display device of FIG. 6.

Referring to FIGS. 5, 6, and 7, the OLED display device 100 may include a substrate, which will be described below, a plurality of fan-out wirings 500, etc. The fan-out wirings 500 may include a low fan-out wiring 510, a middle fan-out wiring 520, and an upper fan-out wiring 530 (e.g., a first fan-out wiring group). The low fan-out wiring 510 may include a first low fan-out wiring 511, a second low fan-out wiring 512, and a third low fan-out wiring 513. The middle fan-out wiring 520 may include a first middle fan-out wiring 521 and a second middle fan-out wiring 522. The upper fan-out wiring 530 may include a first upper fan-out wiring 531 and a second upper fan-out wiring 532.

The fan-out wirings 500 may include the low fan-out wiring 510, the middle fan-out wiring 520, and the upper fan-out wiring 530 as shown in FIG. 5. In some implementations, the fan-out wirings 500 may further include a fan-out wiring 514 and seven fan-out wirings (e.g., a second fan-out wiring group) as well as the first fan-out wiring group. Here, the first fan-out wiring group and the second fan-out wiring group may be substantially symmetrical to each other with respect to the fan-out wiring 514, and a configuration of the first fan-out wiring group may be substantially identical to a configuration of the second fan-out wiring group. That is, the fan-out wirings 500 may include fifteen fan-out wirings. For convenience of descriptions, it is assumed that the fan-out wirings 500 include the first fan-out wiring group. In example embodiments, the data signal may be applied to the fan-out wirings 500.

In example embodiments, the low fan-out wiring 510, the middle fan-out wiring 520, and the upper fan-out wiring 530 may be disposed on different layers from each other. For example, the low fan-out wiring 510 may be disposed on the substrate, and the middle fan-out wiring 520 may be disposed on the low fan-out wiring 510. The upper fan-out wiring 530 may be disposed on the middle fan-out wiring 520. The middle fan-out wiring 520 may overlap at least a portion of the low fan-out wiring 510, and the upper fan-out wiring 530 may overlap at least a portion of the low fan-out wiring 510. For example, as illustrated in FIG. 6, the first middle fan-out wiring 521 may overlap a first side portion of the first low fan-out wiring 511, and the first upper fan-out wiring 531 may overlap a second side portion of the first low fan-out wiring 511 and a first side portion of the second low fan-out wiring 512. The second middle fan-out wiring 522 may overlap a second side portion of the second low fan-out wiring 512 and a first side portion of the third low fan-out wiring 513, and the second upper fan-out wiring 532 may overlap a second side portion of the third low fan-out wiring 513. Here, the first side portion may be opposite to the second side portion. Herein, overlapping of the low, middle, and upper fan-out wirings 510, 520, and 530 refers to overlapping in a stacking direction of the wirings, for example, a direction perpendicular to the D1, D2, and D3 directions.

The fan-out wirings 500 may be disposed in the peripheral region 40 (e.g., the peripheral region 40 located between the light emitting region 30 and the bending region 50) on the substrate. Each of the fan-out wirings 500 may have a straight line portion and an oblique line portion. The straight line portion may extend in the first direction D1 from the pad region 60 into the display region 10. The oblique line portion may extend in a direction that is different from the first direction D1. The straight line portion and the oblique line portion may be integrally formed. The oblique line portion may have a first distal end connected to the straight line portion and a second distal end that is aligned to one side of the light emitting region 30. The second distal end of the oblique line portion may be connected to a data wiring disposed in the light emitting region 30, and the data wiring may be connected to the light emitting structures 200. Accordingly, the data signal may be applied to the light emitting structures 200. The fan-out wiring 514 may have only a straight line portion.

For example, referring to the first low fan-out wiring 511 illustrated in a left side of FIG. 7, the first low fan-out wiring 511 may have a straight line portion 511A and an oblique line portion 511B. The straight line portion 511A may extend from the pad region 60 in the first direction D1, and the oblique line portion 511B may extend in a direction that is different from the first direction D1. The straight line portion 511A and the oblique line portion 511B may be integrally formed. Referring to the first low fan-out wiring 511 illustrated in a right side of FIG. 7, the oblique line portion 511B may have a first distal end 511C connected to the straight line portion 511A and a second distal end 511D that is aligned to one side of the light emitting region 30.

In this way, each of the second low fan-out wiring 512, the third low fan-out wiring 513, the first middle fan-out wiring 521, the second middle fan-out wiring 522, the first upper fan-out wiring 531, and the second upper fan-out wiring 532 may have a straight line portion, an oblique line portion, a first distal end, and a second distal end.

The fan-out wirings 500 may include at least four fan-out wirings. For example, in some implementations, the fan-out wirings 500 may include seven fan-out wirings.

The fan-out wirings 500 may include first through (N)th fan-out wirings, where N is a multiple of 4. A (4K+1)th fan-out wiring among the first through (N)th fan-out wirings may correspond to the middle fan-out wiring 520, where K is an integer between 0 and (N/4)−1. (4K+2)th and (4K+4)th fan-out wirings among the first through (N)th fan-out wirings may correspond to the low fan-out wiring 510. A (4K+3)th fan-out wiring among the first through (N)th fan-out wirings may correspond to the upper fan-out wiring 530. The (4K+1)th fan-out wiring may overlap a first side portion of the (4K+2)th fan-out wiring. The (4K+3)th fan-out wiring may overlap a second side portion of the (4K+2)th fan-out wiring and a first side portion of the (4K+4)th fan-out wiring. The (4K+1)th fan-out wiring, the (4K+2)th and (4K+4)th fan-out wirings, and the (4K+3)th fan-out wiring may be located at different layers to each other.

In a general OLED display device, fan-out wirings may be disposed in the peripheral region 40 such that a data signal is applied to the light emitting structures 200 disposed in the light emitting region 30. The fan-out wirings may have a configuration where the fan-out wirings are disposed only in one layer (e.g., a configuration including a middle fan-out wiring or an upper fan-out wiring) or a configuration where the fan-out wirings are alternately disposed in two layers (e.g., a configuration including the middle fan-out wiring and the upper fan-out wiring). In addition, each of the fan-out wirings in the peripheral region 40 may be aligned to one side of the light emitting region 30 through an oblique line portion. For example, a length of a straight line portion of the fan-out wiring should be relatively decreased to reduce a dead space, and an internal angle formed between the straight line portion and the oblique line portion should be relatively small (refer to FIG. 7). Here, when the internal angle formed between the straight line portion and the oblique line portion is small, a distance between the fan-out wirings may be decreased. If a distance between the fan-out wirings were to be decreased in a portion where the oblique line portion is located to reduce the peripheral region 40 (e.g., the dead space) of the OLED display device, a short (or broken, cut, etc.) phenomenon between the fan-out wirings could occur. In addition, if a width of each of the fan-out wirings were to be decreased to prevent the short phenomenon, a wiring resistance of the fan-out wirings may be relatively increased.

The OLED display device 100 according to example embodiments may include the fan-out wirings 500 disposed in three layers. For example, as the low fan-out wiring 510 is disposed, the short phenomenon between the fan-out wirings 500 may be reduced because a space where the middle fan-out wiring 520 and the upper fan-out wiring 530 are disposed may be relatively increased. In addition, as a wiring width of each of the fan-out wirings 500 is relatively increased due to a relatively increased space, the wiring resistance may be reduced. Accordingly, a wiring defect of the OLED display device 100 may be reduced, and the dead space may be decreased.

Figure 8:
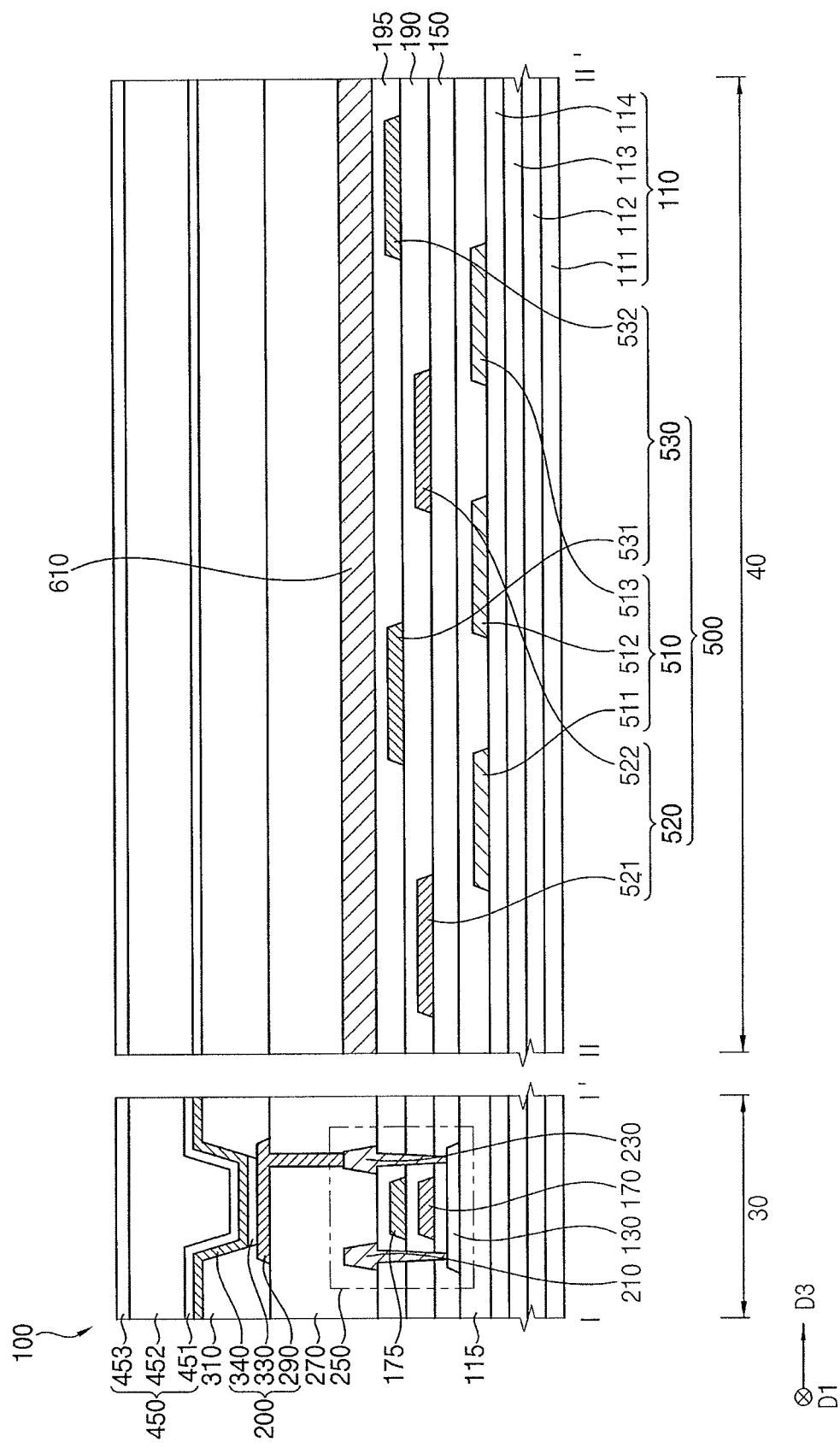
FIG. 8 illustrates a cross-sectional view taken along lines I-I' and II-II' of FIG. 5.

FIG. 8 illustrates a cross-sectional view taken along lines I-I' and II-II' of FIG. 5. For example, a peripheral region 40 illustrated in FIG. 8 may correspond to a portion of a peripheral region 40 that is located between a light emitting region 30 and a pad region 60, as shown in FIG. 1.

Referring to FIG. 8, the OLED display device 100 may include a substrate 110, a buffer layer 115, a semiconductor element 250, a light emitting structure 200, fan-out wirings 500, a power supply wiring 610, a planarization layer 270, a pixel defining layer 310, a thin film encapsulation ("TFE") structure 450, etc. The substrate 110 may include a first organic film layer 111, a first barrier layer 112, a second organic film layer 113, and a second barrier layer 114. The semiconductor element 250 may include an active layer 130, a gate insulation layer 150, a first gate electrode 170, a first insulating interlayer 190, a second gate electrode 175, a second insulating interlayer 195, a source electrode 210, and a drain electrode 230. The light emitting structure 200 may include a lower electrode 290, a light emitting layer 330, and an upper electrode 340. The TFE structure 450 may include a first TFE layer 451, a second TFE layer 452, and a third TFE layer 453. The fan-out wirings 500 may include a low fan-out wiring 510, a middle fan-out wiring 520, and an upper fan-out wiring 530. The low fan-out wiring 510 may include a first low fan-out wiring 511, a second low fan-out wiring 512, and a third low fan-out wiring 513. The middle fan-out wiring 520 may include a first middle fan-out wiring 521 and a second middle fan-out wiring 522. The upper fan-out wiring 530 may include a first upper fan-out wiring 531 and a second upper fan-out wiring 532.

As described above, when the OLED display device 100 includes the substrate 110 and the TFE structure 450 that have flexibility, and a bending region 50 is bent on an axis with respect to a third direction D3, the OLED display device 100 may serve as a flexible OLED display device having a bending region 50 with a bent shape.

The substrate 110 including transparent or opaque insulation materials may be provided. The substrate 110 may include a flexible transparent resin substrate. In example embodiments, the substrate 110 may have a configuration where the first organic film layer 111, the first barrier layer 112, the second organic film layer 113, and the second barrier layer 114 are sequentially stacked. For example, the first barrier layer 112 may be disposed on the entire first organic film layer 111, and the second organic film layer 113 may be disposed on the entire first barrier layer 112. The second barrier layer 114 may be disposed on the entire second organic film layer 113.

Each of the first barrier layer 112 and the second barrier layer 114 may include inorganic materials such as a silicon compound, metal oxide, etc. For example, each of the first barrier layer 112 and the second barrier layer 114 may include silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), etc. In addition, each of the first organic film layer 111 and the second organic film layer 113 may include organic materials such as photoresist, polyacryl-based resin, polyimide-based resin, a polyamide-based resin, a siloxane-based resin, acryl-based resin, epoxy-based resin, etc. In example embodiments, the first and second barrier layers 112 and 114 each may include SiOx, and may block moisture or water that is permeated through the first and second organic film layers 111 and 113. Further, the first and second organic film layers 111 and 113 each may include a polyimide-based resin such that the OLED display device 100 has flexibility, and the polyimide-based resin may be random copolymer or block copolymer. The polyimide-based resin may have a high transparency, a low coefficient of thermal expansion, and a high glass transition temperature. When the polyimide-based resin includes an imide radical, a heat resistance, a chemical resistance, a wear resistance, and electrical characteristics may be excellent.

The substrate 110 may be relatively thin and flexible. The substrate 110 may be disposed on a rigid glass substrate to help support the formation of the semiconductor element 250, the fan-out wirings 500, and the light emitting structure 200. In a manufacturing the OLED display device 100, after the buffer layer 115 is formed on the second barrier layer 114 of the substrate 110, the semiconductor element 250, the fan-out wirings 500, and the light emitting structure 200 may be formed on the buffer layer 115. After the semiconductor element 250, the fan-out wirings 500, and the light emitting structure 200 are formed on the buffer layer 115, the rigid glass substrate on which the substrate 110 is disposed may be removed. In this regard, it may be difficult to directly form the semiconductor element 250, the fan-out wirings 500, and the light emitting structure 200 on the substrate 110 because the substrate 110 is relatively thin and flexible. Accordingly, the semiconductor element 250, the fan-out wirings 500, and the light emitting structure 200 may be formed on the substrate 110 and the rigid glass substrate, and then the substrate 110 including the first organic film layer 111, the first barrier layer 112, the second organic film layer 113, and the second barrier layer 114 may serve as the substrate 110 of the OLED display device 100 after the removal of the rigid glass substrate.

The OLED display device 100 may have a display region 10 including a light emitting region 30 and a peripheral region 40 and a pad region 60 including the bending region 50 and a pad electrode region 70, as illustrated in FIG. 1. Accordingly, the substrate 110 may be divided into the light emitting region 30, the peripheral region 40 (e.g., the peripheral region 40 located between the light emitting region 30 and the bending region 50 of FIG. 1), the bending region 50, and the pad electrode region 70 (refer to FIG. 1).

In some implementations, the substrate 110 may include a quartz substrate, a synthetic quartz substrate, a calcium fluoride substrate, a fluoride-doped quartz substrate, a soda-lime glass substrate, a non-alkali glass substrate etc.

In example embodiments, the substrate 110 may include a single layer or a plurality of layers. For example, in some implementations, the substrate 110 may include four layers.

The low fan-out wiring 510 may be disposed in the peripheral region 40 on the substrate 110. As described above, the low fan-out wiring 510 may include the first low fan-out wiring 511, the second low fan-out wiring 512, and the third low fan-out wiring 513. The first low fan-out wiring 511, the second low fan-out wiring 512, and the third low fan-out wiring 513 may be spaced apart from each other by a predetermined distance. In example embodiments, the low fan-out wiring 510 may be in direct contact with the substrate 110. For example, the low fan-out wiring 510 may be in direct contact with the second barrier layer 114 of the substrate 110. A data signal may be applied to the low fan-out wiring 510.

The low fan-out wiring 510 may be electrically connected to light emitting structures that emit a same light, among a plurality of light emitting structures (or sub-pixels) capable of emitting a red light, a green light, and a blue light. For example, the low fan-out wiring 510 may be coupled to (or connected to) a light emitting structure that emits the green light. In some implementations, the first low fan-out wiring 511 may be coupled to a light emitting structure that emits the red light, and the second low fan-out wiring 512 may be coupled to a light emitting structure that emits the green light. The third low fan-out wiring 513 may be coupled to a light emitting structure that emits the blue light.

For example, a cross-sectional view of the first low fan-out wiring 511, the second low fan-out wiring 512, and the third low fan-out wiring 513, each illustrated in FIG. 8, may correspond to a straight line portion of the first low fan-out wiring 511, the second low fan-out wiring 512, and the third low fan-out wiring 513 each of FIG. 5. A cross-sectional view of the straight line portion may be substantially a same as that of an oblique line portion of the first low fan-out wiring 511, the second low fan-out wiring 512, and the third low fan-out wiring 513 each of FIG. 5. In some implementations, a first portion where the low fan-out wiring 510 overlaps the middle fan-out wiring 520 and a second portion where the low fan-out wiring 510 overlaps the upper fan-out wiring 530 may be relatively increased in the oblique line portion.

The low fan-out wiring 510 may include a metal, an alloy, metal nitride, conductive metal oxide, transparent conductive materials, etc. For example, the low fan-out wiring 510 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an alloy of aluminum, aluminum nitride (AlNx), an alloy of silver, tungsten nitride (WNx), an alloy of copper, an alloy of molybdenum, titanium nitride (TiNx), chromium nitride (CrNx), tantalum nitride (TaNx), strontium ruthenium oxide (SRO), zinc oxide (ZnOx), indium tin oxide (ITO), tin oxide (SnOx), indium oxide (InOx), gallium oxide (GaOx), indium zinc oxide (IZO), etc. These may be used alone or in a suitable combination thereof. In some implementations, the low fan-out wiring 510 may have a multi-layered structure including a plurality of layers.

The buffer layer 115 may be disposed on the substrate 110 and the low fan-out wiring 510. In example embodiments, the buffer layer 115 may cover the low fan-out wiring 510 in the peripheral region 40 on the substrate 110, and may be entirely disposed in the light emitting region 30 and the peripheral region 40. For example, the buffer layer 115 may sufficiently cover the low fan-out wiring 510 on the substrate 110, and may have a substantially flat upper surface without a step around the low fan-out wiring 510. In some implementations, the buffer layer 115 may cover the low fan-out wiring 510 on the substrate 110 and may have a substantially uniform thickness along a profile of the low fan-out wiring 510.

The buffer layer 115 may prevent the diffusion of metal atoms and/or impurities from the substrate 110 into the semiconductor element 250. The buffer layer 115 may control a rate of a heat transfer in a crystallization process for forming the active layer 130, thereby obtaining a substantially uniform active layer. The buffer layer 115 may improve a surface flatness of the substrate 110 when a surface of the substrate 110 is relatively irregular. The buffer layer 115 may include a silicon compound, a metal oxide, etc. In some example embodiments, according to a type of the substrate 110, at least two buffer layers 115 may be provided on the substrate 110, or the buffer layer 115 may be omitted.

The active layer 130 may be disposed in the light emitting region 30 on the buffer layer 115. The active layer 130 may include an oxide semiconductor, an inorganic semiconductor (e.g., amorphous silicon, polysilicon, etc.), an organic semiconductor, etc.

The gate insulation layer 150 may be disposed on the active layer 130. The gate insulation layer 150 may cover the active layer 130 in the light emitting region 30 on the buffer layer 115 and may extend in a direction from the light emitting region 30 into the pad region 60. For example, the gate insulation layer 150 may be entirely disposed in the light emitting region 30 and the peripheral region 40 on the buffer layer 115. For example, the gate insulation layer 150 may sufficiently cover the active layer 130 on the buffer layer 115, and may have a substantially flat upper surface without a step around the active layer 130. In some implementations, the gate insulation layer 150 may cover the active layer 130 on the buffer layer 115 and may be disposed as a substantially uniform thickness along a profile of the active layer 130. The gate insulation layer 150 may include silicon compound, metal oxide, etc.

The first gate electrode 170 may be disposed in the light emitting region 30 on the gate insulation layer 150. The first gate electrode 170 may be disposed on a portion of the gate insulation layer 150 under which the active layer 130 is located. The first gate electrode 170 may include a metal, a metal alloy, metal nitride, conductive metal oxide, transparent conductive materials, etc. These may be used alone or in a suitable combination thereof. In some example embodiments, the first gate electrode 170 may have a multi-layered structure including a plurality of layers.

The middle fan-out wiring 520 may be disposed on the gate insulation layer 150 in the peripheral region 40. The middle fan-out wiring 520 may overlap at least a portion of the low fan-out wiring 510. As described above, the middle fan-out wiring 520 may include the first middle fan-out wiring 521 and the second middle fan-out wiring 522. The first middle fan-out wiring 521 and the second middle fan-out wiring 522 may be spaced apart from each other by a predetermined distance. In example embodiments, the first middle fan-out wiring 521 may overlap at least a portion of the first low fan-out wiring 511. For example, the first middle fan-out wiring 521 may overlap a first side portion of the first low fan-out wiring 511. In addition, the second middle fan-out wiring 522 may overlap at least a portion of the second low fan-out wiring 512 and at least a portion of the third low fan-out wiring 513. For example, the second middle fan-out wiring 522 may overlap a second side portion of the second low fan-out wiring 512 and a first side portion of the third low fan-out wiring 513. A data signal may be applied to the middle fan-out wiring 520.

The middle fan-out wiring 520 may be electrically connected to light emitting structures that emit a same light, among a plurality of light emitting structures capable of emitting a red light, a green light, and a blue light. For example, the middle fan-out wiring 520 may be coupled to a light emitting structure that emits the red light. In some implementations, the middle fan-out wiring 520 may be coupled to a light emitting structure that emits the blue light.

For example, a cross-sectional view of the first middle fan-out wiring 521 and the second middle fan-out wiring 522 each illustrated in FIG. 8 may correspond to a straight line portion of the first middle fan-out wiring 521 and the second middle fan-out wiring 522 each of FIG. 5. A cross-sectional view of the straight line portion may be substantially a same as that of an oblique line portion of the first middle fan-out wiring 521 and the second middle fan-out wiring 522 each of FIG. 5.

In example embodiments, the first gate electrode 170 and the middle fan-out wiring 520 may be located at a same layer and may be simultaneously (or concurrently) formed using same materials. For example, the middle fan-out wiring 520 may include a metal, an alloy, metal nitride, conductive metal oxide, transparent conductive materials, etc. These may be used alone or in a suitable combination thereof. In some implementations, the middle fan-out wiring 520 may have a multi-layered structure including a plurality of layers.

The first insulating interlayer 190 may be disposed on the first gate electrode 170 and on the middle fan-out wiring 520. The first insulating interlayer 190 may cover the first gate electrode 170 in the light emitting region 30 on the gate insulation layer 150, and may extend in a direction from the light emitting region 30 into the pad region 60. The first insulating interlayer 190 may cover the middle fan-out wiring 520 on the gate insulation layer 150 in the peripheral region 40. For example, the first insulating interlayer 190 may be disposed on the entire gate insulation layer 150. For example, the first insulating interlayer 190 may sufficiently cover the first gate electrode 170 and the middle fan-out wiring 520 on the gate insulation layer 150, and may have a substantially flat upper surface without a step around the first gate electrode 170 and the middle fan-out wiring 520. In some implementations, the first insulating interlayer 190 may cover the first gate electrode 170 and the middle fan-out wiring 520 on the gate insulation layer 150, and may be disposed with a substantially uniform thickness along a profile of the first gate electrode 170 and the middle fan-out wiring 520. The first insulating interlayer 190 may include silicon compound, metal oxide, etc.

The second gate electrode 175 may be disposed in the light emitting region 30 on the first insulating interlayer 190. The second gate electrode 175 may be disposed on a portion of the first insulating interlayer 190 under which the first gate electrode 170 is located. In some implementations, the first gate electrode 170 and the second gate electrode 175 may serve as a storage capacitor. The second gate electrode 175 may include a metal, a metal alloy, metal nitride, conductive metal oxide, transparent conductive materials, etc. These may be used alone or in a suitable combination thereof.

In some example embodiments, the second gate electrode 175 may have a multi-layered structure including a plurality of layers.

The upper fan-out wiring 530 may be disposed on the first insulating interlayer 190 in the peripheral region 40. The upper fan-out wiring 530 may overlap at least a portion of the low fan-out wiring 510. As described above, the upper fan-out wiring 530 may include the first upper fan-out wiring 531 and the second upper fan-out wiring 532. The first upper fan-out wiring 531 and the second upper fan-out wiring 532 may be spaced apart from each other by a predetermined distance. In example embodiments, the first upper fan-out wiring 531 may overlap at least a portion of the first low fan-out wiring 511 and at least a portion of the second low fan-out wiring 512. For example, the first upper fan-out wiring 531 may overlap a second side portion of the first low fan-out wiring 511 and a first side portion of the second low fan-out wiring 512. In addition, the second upper fan-out wiring 532 may overlap at least a portion of the third low fan-out wiring 513. For example, the second upper fan-out wiring 532 may overlap a second side portion of the third low fan-out wiring 513. A data signal may be applied to the upper fan-out wiring 530.

The upper fan-out wiring 530 may be electrically connected to light emitting structures that emit a same light, among a plurality of light emitting structures capable of emitting a red light, a green light, and a blue light. For example, the upper fan-out wiring 530 may be coupled to a light emitting structure that emits the blue light. In some implementations, the upper fan-out wiring 530 may be coupled to a light emitting structure that emits the green light.

A cross-sectional view of the first upper fan-out wiring 531 and the second upper fan-out wiring 532 each illustrated in FIG. 8 may correspond to a straight line portion of the first upper fan-out wiring 531 and the second upper fan-out wiring 532 each of FIG. 5. A cross-sectional view of the straight line portion may be substantially a same as that of an oblique line portion of the first upper fan-out wiring 531 and the second upper fan-out wiring 532 each of FIG. 5.

In example embodiments, the second gate electrode 175 and the upper fan-out wiring 530 may be located at a same layer and may be simultaneously formed using same materials. The upper fan-out wiring 530 may include, for example, a metal, an alloy, metal nitride, conductive metal oxide, transparent conductive materials, etc. These may be used alone or in a suitable combination thereof. In some implementations, the upper fan-out wiring 530 may have a multi-layered structure including a plurality of layers. Accordingly, the fan-out wirings 500 including the low fan-out wiring 510, the middle fan-out wiring 520, and the upper fan-out wiring 530 may be disposed.

In example embodiments, when the OLED display device 100 includes the low fan-out wiring 510 disposed between the substrate 110 and the buffer layer 115, a short phenomenon between the fan-out wirings 500 may be reduced because a space where the middle fan-out wiring 520 and the upper fan-out wiring 530 are disposed is relatively increased. In addition, when a wiring width of each of the fan-out wirings 500 is relatively increased due to a relatively increased space, a wiring resistance may be reduced.

Experimentally, when a portion of the low fan-out wiring 510 overlaps the middle fan-out wiring 520 and the upper fan-out wiring 530, parasitic capacitance may be generated between the low fan-out wiring 510 and the middle fan-out wiring 520 and between the low fan-out wiring 510 and the upper fan-out wiring 530. For example, a parasitic capacitance generated between the low fan-out wiring 510 and the middle fan-out wiring 520 was measured to be about 0.1245 $fF/\mu m^2$, and a parasitic capacitance generated between the low fan-out wiring 510 and the upper fan-out wiring 530 was measured to be about 0.1243 $fF/\mu m^2$. That is, although the parasitic capacitance was generated between the low fan-out wiring 510 and the middle fan-out wiring 520 and between the low fan-out wiring 510 and the upper fan-out wiring 530, it may be seen that the parasitic capacitance value was very small. Thus, although the OLED display device 100 includes the low fan-out wiring 510 disposed between the substrate 110 and the buffer layer 115, parasitic capacitance may not be enough to cause a defective data signal.

In addition, as a total area where the low fan-out wiring 510 and the middle fan-out wiring 520 are overlapped and a total area where the low fan-out wiring 510 and the upper fan-out wiring 530 are overlapped are relatively increased, a data charging time may be relatively reduced. For example, a conventional data charging time was measured to be about 3.89 μs, and the data charging time of example embodiments was measured to be about 3.84 μs. That is, the data charging time of example embodiments was reduced by 0.05 μs (e.g., about 1.29% reduction). However, it may be seen that the reduced data charging time is very small. Thus, although the OLED display device 100 includes the low fan-out wiring 510 disposed between the substrate 110 and the buffer layer 115, there is no significant effect regarding the data charging time.

In some example embodiments, the OLED display device 100 may further include a conductive pattern that is located on a same layer with the low fan-out wiring 510. The conductive pattern may be disposed under the semiconductor element 250. For example, when the substrate 110 of the OLED display device 100 includes a polyimide substrate, the polyimide substrate may have a relatively greater amount of electrical charge than a glass substrate. When the semiconductor element 250 is driven, the electrical charge could interfere with a drive of the semiconductor element 250 because the electric charges may be non-uniformly distributed under the semiconductor element 250. For example, a threshold voltage of the semiconductor element 250 may be changed because of a non-uniform distribution of the electric charges, and a luminance of the light emitting structure 200 may be changed because of the changed amount of current. For example, reliability and lifetime of the semiconductor element 250 could be reduced. In order to address this issue, the conductive pattern may be placed in an equipotential state by providing a voltage to the conductive pattern, and the electric charges included in the substrate 110 may be uniformly distributed. In some implementations, the conductive pattern may be grounded. In this case, the electric charges included in the substrate 110 may be discharged to an outside through the conductive pattern. In addition, the conductive pattern may disperse a heat generated in the semiconductor element 250 relatively quickly.

The second insulating interlayer 195 may be disposed on the second gate electrode 175 and the upper fan-out wiring 530. The second insulating interlayer 195 may cover the second gate electrode 175 in the light emitting region 30 on the first insulating interlayer 190, and may extend in a direction from the light emitting region 30 into the pad region 60. The second insulating interlayer 195 may cover the upper fan-out wiring 530 in the peripheral region 40 on the first insulating interlayer 190. For example, the second insulating interlayer 195 may be disposed on the entire first insulating interlayer 190. The second insulating interlayer 195 may sufficiently cover the second gate electrode 175 and the upper fan-out wiring 530 on the first insulating interlayer 190 and may have a substantially flat upper surface without a step around the second gate electrode 175 and the upper fan-out wiring 530. In some implementations, the second insulating interlayer 195 may cover the second gate electrode 175 and the upper fan-out wiring 530 on the first insulating interlayer 190 and may be disposed with a substantially uniform thickness along a profile of the second gate electrode 175 and the upper fan-out wiring 530. The second insulating interlayer 195 may include a silicon compound, a metal oxide, etc.

The source electrode 210 and the drain electrode 230 may be disposed in the light emitting region 30 on the second insulating interlayer 195. The source electrode 210 may be in direct contact with a source region of the active layer 130 via a contact hole formed by removing a first portion of the gate insulation layer 150, the first insulating interlayer 190, and the second insulating interlayer 195. The drain electrode 230 may be in direct contact with a drain region of the active layer 130 via a contact hole formed by removing a second portion of the gate insulation layer 150, the first insulating interlayer 190, and the second insulating interlayer 195. Each of the source electrode 210 and the drain electrode 230 may include a metal, an alloy, metal nitride, conductive metal oxide, transparent conductive materials, etc. These may be used alone or in a suitable combination thereof. In some example embodiments, each of the source and drain electrodes 210 and 230 may have a multi-layered structure including a plurality of layers. Accordingly, the semiconductor element 250 including the active layer 130, the gate insulation layer 150, the first gate electrode 170, the first insulating interlayer 190, the second gate electrode 175, the second insulating interlayer 195, the source electrode 210, and the drain electrode 230 may be disposed.

In some implementations, the semiconductor element 250 may have a top gate structure. In some implementations, the semiconductor element 250 may have a bottom gate structure.

In some example embodiments, the OLED display device 100 may include at least one semiconductor element and at least one capacitor. For example, in some implementations, the OLED display device 100 may include one semiconductor element The power supply wiring 610 may be disposed in the peripheral region 40 on the second insulating interlayer 195. The power supply wiring 610 may overlap the fan-out wirings 500. A high power supply voltage may be applied to the power supply wiring 610. In example embodiments, the power supply wiring 610, the source electrode 210, and the drain electrode 230 may be located at a same layer and may be simultaneously formed using same materials. The power supply wiring 610 may include, for example, a metal, an alloy, metal nitride, conductive metal oxide, transparent conductive materials, etc. These may be used alone or in a suitable combination thereof. In some implementations, the power supply wiring 610 may have a multi-layered structure including a plurality of layers.

The planarization layer 270 may be disposed on the second insulating interlayer 195, the power supply wiring 610, the source electrode 210, and the drain electrode 230. The planarization layer 270 may cover the source and drain electrodes 210 and 230 in the light emitting region 30 on the second insulating interlayer 195 and may cover the power supply wiring 610 in the peripheral region 40 on the second insulating interlayer 195. For example, the planarization layer 270 may be disposed with a high thickness in the light emitting region 30 and the peripheral region 40. The planarization layer 270 may have a substantially flat upper surface. A planarization process may be further performed on the planarization layer 270 to implement the flat upper surface of the planarization layer 270. In some implementations, the planarization layer 270 may be disposed with a substantially uniform thickness along a profile of the power supply wiring 610 and the source and drain electrodes 210 and 230 in the light emitting region 30 and the peripheral region 40 on the second insulating interlayer 195. The planarization layer 270 may include organic materials or inorganic materials. For example, the planarization layer 270 may include organic materials.

The lower electrode 290 may be disposed in the light emitting region 30 on the planarization layer 270. The lower electrode 290 may be in contact with the drain electrode 230 via a contact hole formed by removing a portion of the planarization layer 270. The lower electrode 290 may be electrically connected to the semiconductor element 250. The lower electrode 290 may include a metal, a metal alloy, metal nitride, conductive metal oxide, transparent conductive materials, etc. These may be used alone or in a suitable combination thereof. In some example embodiments, the lower electrode 290 may have a multi-layered structure including a plurality of layers.

The pixel defining layer 310 may be disposed in the light emitting region 30 on the planarization layer 270 and expose a portion of the lower electrode 290. The pixel defining layer 310 may extend in a direction from the light emitting region 30 into the pad region 60. For example, the pixel defining layer 310 may cover both lateral portions of the lower electrode 290 and may extend in a direction from the light emitting region 30 into the pad region 60, and may be disposed in the peripheral region 40 on the planarization layer 270. In some implementations, the pixel defining layer 310 may be disposed only in the light emitting region 30, and not in the peripheral region 40. The pixel defining layer 310 may include organic materials or inorganic materials. In some implementations, the pixel defining layer 310 may include organic materials.

The light emitting layer 330 may be disposed on a portion of the lower electrode 290 exposed by the pixel defining layer 310. The light emitting layer 330 may be formed using at least one of light emitting materials capable of generating different colors of light (e.g., a red light, a blue light, and a green light, etc.) according to sub-pixels. In some implementations, the light emitting layer 330 may generally generate a white light by stacking a plurality of light emitting materials capable of generating different colors of light such as a red light, a green light, a blue light, etc. In this case, a color filter may be disposed on the light emitting layer 330. The color filter may include at least one selected from a red color filter, a green color filter, and a blue color filter. In some implementations, the color filter may include a yellow color filter, a cyan color filter, and a magenta color filter. The color filter may include a photosensitive resin, a color photoresist, etc.

The upper electrode 340 may be disposed in the light emitting region 30 on the pixel defining layer 310 and the light emitting layer 330. The upper electrode 340 may include a metal, a metal alloy, metal nitride, conductive metal oxide, transparent conductive materials, etc. These may be used alone or in a suitable combination thereof. In some example embodiments, the upper electrode 340 may have a multi-layered structure including a plurality of layers. Accordingly, the light emitting structure 200 including the lower electrode 290, the light emitting layer 330, and the upper electrode 340 may be disposed.

The first TFE layer 451 may be disposed in the light emitting region 30 on the upper electrode 340 and in the peripheral region 40 on the pixel defining layer 310. The first TFE layer 451 may cover the upper electrode 340 in the light emitting region 30 and may be disposed as a substantially uniform thickness along a profile of the upper electrode 340. The first TFE layer 451 may cover the pixel defining layer 310 in the peripheral region 40 and may be disposed with a substantially uniform thickness along a profile of the pixel defining layer 310. In some implementations, the first TFE layer 451 may be omitted from the peripheral region 40. The first TFE layer 451 may prevent the light emitting structure 200 from being deteriorated by the permeation of moisture, water, oxygen, etc. In addition, the first TFE layer 451 may protect the light emitting structure 200 from external impacts. The first TFE layer 451 may include inorganic materials having flexibility.

The second TFE layer 452 may be disposed in the light emitting region 30 and the peripheral region 40 on the first TFE layer 451. In some implementations, the second TFE layer 452 may be omitted from the peripheral region 40. The second TFE layer 452 may improve the flatness of the OLED display device 100, and may protect the light emitting structure 200. The second TFE layer 452 may include organic materials having the flexibility.

The third TFE layer 453 may be disposed in the light emitting region 30 and the peripheral region 40 on the second TFE layer 452. The third TFE layer 453 may cover the second TFE layer 452, and may be disposed with a substantially uniform thickness along a profile of the second TFE layer 452. In some implementations, the third TFE layer 453 may be omitted from the peripheral region 40. The third TFE layer 453 together with the first TFE layer 451 and the second TFE layer 452 may prevent the light emitting structure 200 from being deteriorated by the permeation of moisture, water, oxygen, etc. In addition, the third TFE layer 453 together with the first and second TFE layers 451 and 452 may protect the light emitting structure 200 from external impacts. The third TFE layer 453 may include inorganic materials having the flexibility. Accordingly, the TFE structure 450 including the first TFE layer 451, the second TFE layer 452, and the third TFE layer 453 may be disposed.

In some implementations, the TFE structure 450 may have a five-layer structure where first to fifth TFE layers are stacked or a seven-layers structure where first to seventh TFE layers are stacked.

When the OLED display device 100 in accordance with example embodiments includes the fan-out wirings 500 having three layers structure that includes the low fan-out wiring 510, the middle fan-out wiring 520, and the upper fan-out wiring 530, a short phenomenon between the fan-out wirings 500 may be reduced, and a wiring resistance may be decreased. Accordingly, a wiring defect of the OLED display device 100 may be reduced, and the dead space (e.g., corresponding to the peripheral region 40 located between the light emitting region 30 and the pad region 60) may be decreased.

Figure 9:
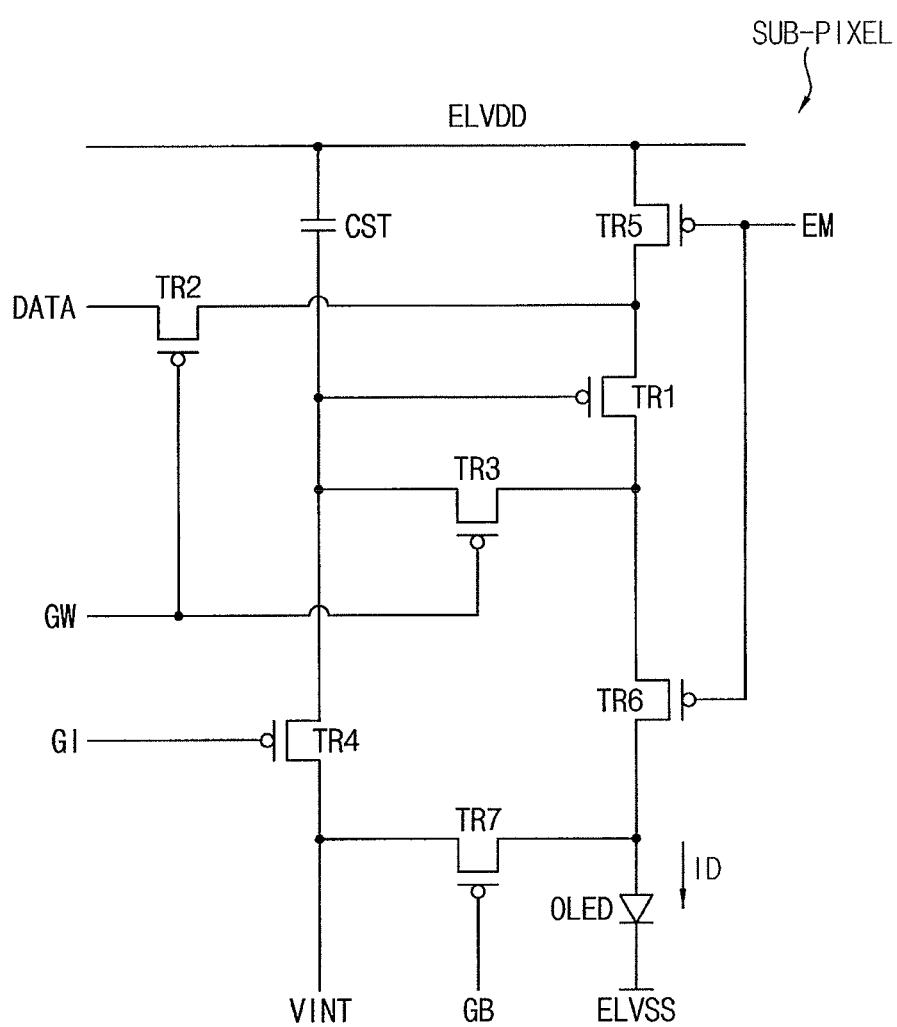
FIG. 9 illustrates a circuit diagram for describing an OLED and transistors included in the OLED display device of FIG. 8.

FIG. 9 illustrates a circuit diagram for describing an OLED and transistors included in the OLED display device of FIG. 8. The OLED display device 100 may include, for example, a plurality of sub-pixels. The sub-pixels each may include a circuit corresponding to the circuit illustrated in FIG. 9.

Referring to FIG. 9, the OLED display device 100 may include an OLED (e.g., the light emitting structure 200 of FIG. 8), first through seventh transistors TR1, TR2, TR3, TR4, TR5, TR6, and TR7, and a storage capacitor CST, etc.

The OLED may emit light based on a driving current ID. The OLED may include a first terminal and a second terminal. In example embodiments, the second terminal of the OLED receives a low power supply ELVSS. For example, the first terminal of the OLED may be an anode terminal, and the second terminal of the OLED may be a cathode terminal. In some implementations, the first terminal of the OLED may be a cathode terminal, and the second terminal of the OLED may be an anode terminal. In example embodiments, the anode terminal of the OLED may correspond to the lower electrode 290 of FIG. 8, and the cathode terminal of the OLED may correspond to the upper electrode 340 of FIG. 8.

The first transistor TR1 may include a gate terminal, a first terminal, and a second terminal. In example embodiments, the first terminal of the first transistor TR1 may be a source terminal, and the second terminal of the first transistor TR1 may be a drain terminal. In some implementations, the first terminal of the first transistor TR1 may be a drain terminal, and the second terminal of the first transistor TR1 may be a source terminal.

The driving current ID may be generated by the first transistor TR1. In example embodiments, the first transistor TR1 may operate in a saturation region. In this case, the first transistor TR1 may generate the driving current ID based on a voltage difference of the gate terminal and the source terminal. A gradation may be implemented based on the amount of the driving current ID generated by the first transistor TR1. In some implementations, the first transistor TR1 may operate in a linear region. In this case, a gradation may be implemented based on the amount of time during which the first transistor TR1 provides the driving current ID to the OLED within one frame.

The second transistor TR2 may include a gate terminal, a first terminal, and a second terminal. A gate signal GW may be applied to the gate terminal of the second transistor TR2. The first terminal of the second transistor TR2 may receive a data signal DATA. The data signal DATA may be generated from the external device 101, and may be applied to the fan-out wirings 500 of FIG. 8 through the pad electrode 470 and the connection electrode 335. The data signal DATA may be provided to the second transistor TR2 through the fan-out wirings 500. The second terminal of the second transistor TR2 may be connected to the first terminal of the first transistor TR1. In example embodiments, the first terminal of the second transistor TR2 may be a source terminal, and the second terminal of the second transistor TR2 may be a drain terminal. In some implementations, the first terminal of the second transistor TR2 may be a drain terminal, and the second terminal of the second transistor TR2 may be a source terminal.

The second transistor TR2 may provide the data signal DATA to the first terminal of the first transistor TR1 while the gate signal GW is activated. In this case, the second transistor TR2 may operate in a linear region.

The third transistor TR3 may include a gate terminal, a first terminal, and a second terminal. The gate terminals of the third transistor TR3 may receive a gate signal GW. The first terminal of the third transistor TR3 may be connected to the gate terminal of the first transistor TR1. The second terminal of the third transistor TR3 may be connected to the second terminal of the first transistor TR1. For example, the gate signal GW may be generated from a gate driver, and the gate signal GW may be applied to the gate terminal of the third transistor TR3 through a gate wiring. In example embodiments, the first terminal of the third transistor TR3 may be a source terminal, and the second terminal of the third transistor TR3 may be a drain terminal. In some embodiments, the first terminal of the third transistor TR3 may be a drain terminal, and the second terminal of the third transistor TR3 may be a source terminal.

The third transistor TR3 may connect the gate terminal of the first transistor TR1 to the second terminal of the first transistor TR1 while the gate signal GW is activated. In this case, the third transistor TR3 may operate in a linear region. For example, the third transistor TR3 may form a diode connection of the first transistor TR1 while the gate signal GW is activated. A voltage difference in an amount that corresponds to a threshold voltage of the first transistor TR1 may occur between the first terminal of the first transistor TR1 and the gate terminal of the first transistor TR1 due to the diode connection. As a result, a sum voltage of the data signal DATA provided to the first terminal of the first transistor TR1 and the voltage difference (i.e., the threshold voltage) may be applied to the gate terminal of the first transistor TR1 while the gate signal GW is activated. Thus, the data signal DATA may be compensated as much as the threshold voltage of the first transistor TR1. The compensated data signal DATA may be applied to the gate terminal of the first transistor TR1. A uniformity of the driving current ID may be improved because of reducing the effect of the threshold voltage of the first transistor TR1.

An input terminal of an initialization voltage wiring where an initialization voltage VINT is provided may be connected to a first terminal of the fourth transistor TR4 and a first terminal of the seventh transistor TR7. An output terminal of an initialization voltage wiring may be connected to a second terminal of the fourth transistor TR4 and a first terminal of a storage capacitor CST.

The fourth transistor TR4 may include a gate terminal, the first terminal, and the second terminal. The gate terminal of the fourth transistor TR4 may receive a gate initialization signal GI. The initialization voltage VINT may be applied to the first terminal of the fourth transistor TR4. The second terminal of the fourth transistor TR4 may be connected to the gate terminal of the first transistor TR1. In example embodiments, the first terminal of the fourth transistor TR4 may be a source terminal, and the second terminal of the fourth transistor TR4 may be a drain terminal. In some implementations, the first terminal of the fourth transistor TR4 may be a drain terminal, and the second terminal of the fourth transistor TR4 may be a source terminal.

The fourth transistor TR4 may apply the initialization voltage VINT to the gate terminal of the first transistor TR1 while the gate initialization signal GI is activated. In this case, the fourth transistor TR4 may operate in the linear region. The fourth transistor TR4 may initialize the gate terminal of the first transistor TR1 as the initialization voltage VINT while the gate initialization signal GI is activated. In example embodiments, a voltage level of the initialization voltage VINT may be sufficiently lower than a voltage level of the data signal DATA maintained by the storage capacitor CST in a previous frame. The initialization voltage VINT may be applied to the gate terminal of the first transistor TR1, which may be a P-channel metal oxide semiconductor ("PMOS") type transistor. In some example embodiments, a voltage level of the initialization voltage VINT may be sufficiently higher than the voltage level of the data signal DATA maintained by the storage capacitor CST in a previous frame. The initialization voltage VINT may be applied to the gate terminal of the first transistor TR1, which may be an N-channel metal oxide semiconductor ("NMOS") type transistor.

In example embodiments, the gate initialization signal GI may be identical to the gate signal GW advanced by one horizontal time period. For example, the gate initialization signal GI applied to sub-pixels located in a (n)th row among a plurality of sub-pixels included in the OLED display device 100 (where n is an integer greater than 2) is substantially a same as the gate signal GW applied to sub-pixels located in a (n−1)th row among a plurality of the sub-pixels. For example, the gate initialization signal GI that is activated may be applied to the sub-pixels located in the (n)th row among the sub-pixels by applying the gate signal GW that is activated to the sub-pixels located in the (n−1)th row among the sub-pixels. As a result, the gate terminal of the first transistor TR1 included in the sub-pixels located in the (n)th row among the sub-pixels may be initialized as the initialization voltage VINT when the data signal DATA is applied to sub-pixels located in the (n−1)th row among the sub-pixels.

The fifth transistor TR5 may include a gate terminal, a first terminal, and a second terminal. An emission signal EM may be applied to the gate terminal of the fifth transistor TR5. A high power supply ELVDD may be applied to the first terminal of the fifth transistor TR5. The second terminal of the fifth transistor TR5 may be connected to the first terminal of the first transistor TR1. In example embodiments, the first terminal of the fifth transistor TR5 may be a source terminal, and the second terminal of the fifth transistor TR5 may be a drain terminal. In some implementations, the first terminal of the fifth transistor TR5 may be a drain terminal, and the second terminal of the fifth transistor TR5 may be a source terminal.

The fifth transistor TR5 may apply the high power supply ELVDD to the first terminal of the first transistor TR1 while the emission signal EM is activated. The fifth transistor TR5 may not apply the high power supply ELVDD while the emission signal EM is inactivated. In this case, the fifth transistor TR5 may operate in the linear region. The fifth transistor TR5 may apply the high power supply ELVDD to the first terminal of the first transistor TR1 while the emission signal EM is activated such that the first transistor TR1 generates the driving current ID. In addition, the fifth transistor TR5 may not apply the high power supply ELVDD while the emission signal EM is inactivated such that the data signal DATA applied to the first terminal of the first transistor TR1 is applied to the gate terminal of the first transistor TR1. The high power supply ELVDD may be generated from the external device 101 and may be applied to the fan-out wiring structure 500 through the pad electrode 470 and the connection electrode 335. For example, the high power supply ELVDD may be provided to the fifth transistor TR5 through the fan-out wiring structure 500.

The sixth transistor TR6 (e.g., the semiconductor element 250 of FIG. 8) may include a gate terminal, a first terminal, and a second terminal. The emission signal EM may be applied to the gate terminal of the sixth transistor TR6. The first terminal of the sixth transistor TR6 may be connected to the second terminal of the first transistor TR1. The second terminal of the sixth transistor TR6 may be connected to the first terminal of the OLED. In example embodiments, the first terminal of the sixth transistor TR6 may be a source terminal, and the second terminal of the sixth transistor TR6 may be a drain terminal. In some implementations, the first terminal of the sixth transistor TR6 may be a drain terminal, and the second terminal of the sixth transistor TR6 may be a source terminal.

The sixth transistor TR6 may provide the driving current ID generated by the first transistor TR1 to the OLED while the emission signal EM is activated. In this case, the sixth transistor TR6 may operate in the linear region. For example, the sixth transistor TR6 may provide the driving current ID generated by the first transistor TR1 to the OLED while the emission signal EM is activated such that the OLED emits light. In addition, the sixth transistor TR6 may disconnect the first transistor TR1 from the OLED while the emission signal EM is inactivated such that the compensated data signal DATA applied to the second terminal of the first transistor TR1 is applied to the gate terminal of the first transistor TR1.

The seventh transistor TR7 may include a gate terminal, a first terminal, and a second terminal. A diode initialization signal GB (e.g., the gate initialization signal GI) may be applied to the gate terminal of the seventh transistor TR7. The initialization voltage VINT may be applied to the first terminal of the seventh transistor TR7. The second terminal of the seventh transistor TR7 may be connected to the first terminal of the OLED. In example embodiments, the first terminal of the seventh transistor TR7 may be a source terminal, and the second terminal of the seventh transistor TR7 may be a drain terminal. In some implementations, the first terminal of the seventh transistor TR7 may be a drain terminal, and the second terminal of the seventh transistor TR7 may be a source terminal.

The seventh transistor TR7 may apply the initialization voltage VINT to the first terminal of the OLED while the diode initialization signal GB is activated. In this case, the seventh transistor TR7 may operate in the linear region. For example, the seventh transistor TR7 may initialize the first terminal of the OLED as the initialization voltage VINT while the diode initialization signal GB is activated.

In some implementations, the gate initialization signal GI and the diode initialization signal GB may be substantially the same signal. An initialization operation of the gate terminal of the first transistor TR1 may not affect an initialization operation of the first terminal of the OLED. For example, the initialization operation of the gate terminal of the first transistor TR1 and the initialization operation of the first terminal of the OLED may be independent of each other. Therefore, the gate initialization signal GI may be used as the diode initialization signal GB, thereby improving the manufacturing efficiency.

The storage capacitor CST may include a first terminal and a second terminal. The storage capacitor CST may be connected between a high power supply wiring and the gate terminal of the first transistor TR1. For example, the first terminal of the storage capacitor CST may be connected to the gate terminal of the first transistor TR1, and the second terminal of the storage capacitor CST may be connected to the high power supply wiring. The storage capacitor CST may maintain a voltage level of the gate terminal of the first transistor TR1 while the gate signal GW is inactivated. The emission signal EM may be activated while the gate signal GW is inactivated. The driving current ID generated by the first transistor TR1 may be provided to the OLED while the emission signal EM is activated. Therefore, the driving current ID generated by the first transistor TR1 may be provided to the OLED based on the voltage level maintained by the storage capacitor CST.

As described above, the OLED display device 100 may further include a conductive pattern that is located at a same layer with the low fan-out wiring 510. The conductive pattern may be disposed under the first through seventh transistors TR1, TR2, TR3, TR4, TR5, TR6, and TR7, and the storage capacitor CST.

Figure 10:
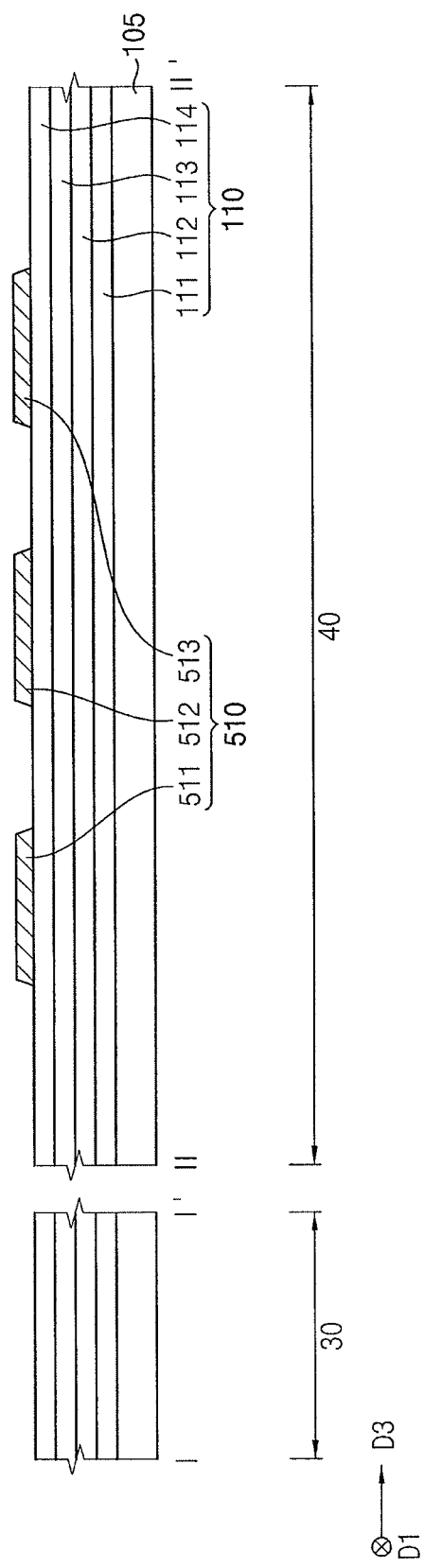
FIGS. 10 through 19 illustrate diagrams depicting stages of a method of manufacturing an OLED display device in accordance with example embodiments.
Figure 11:
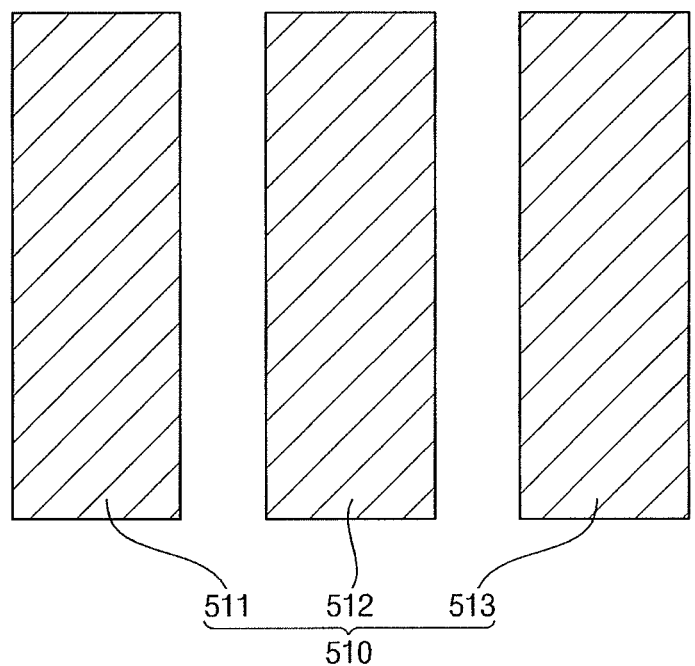
Figure 11:
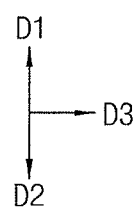
Figure 12:
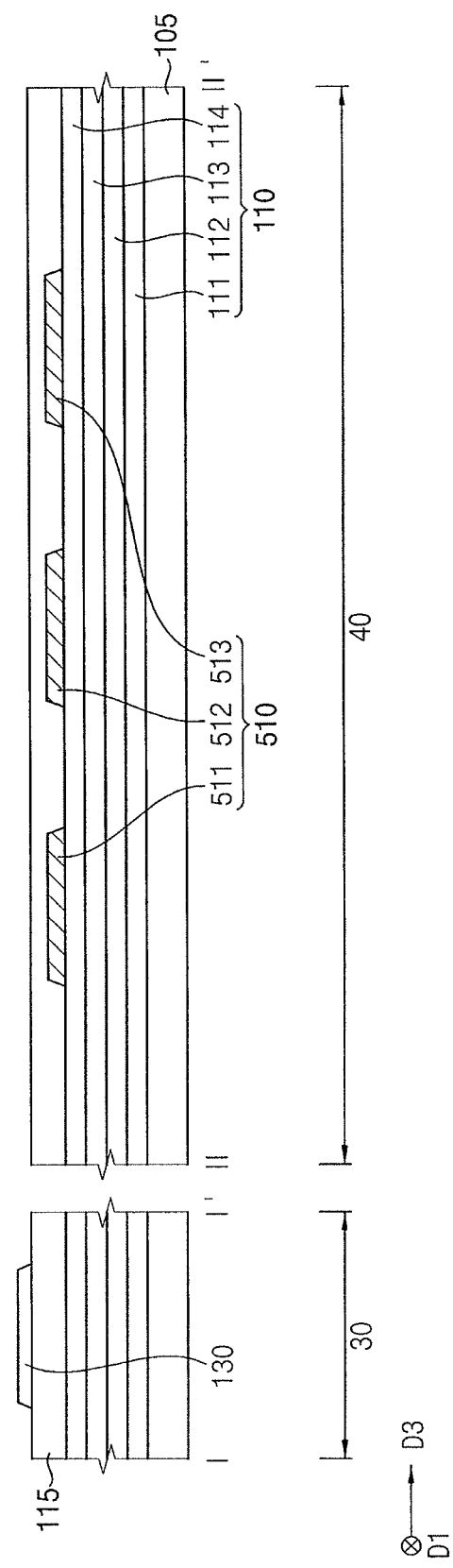
Figure 13:
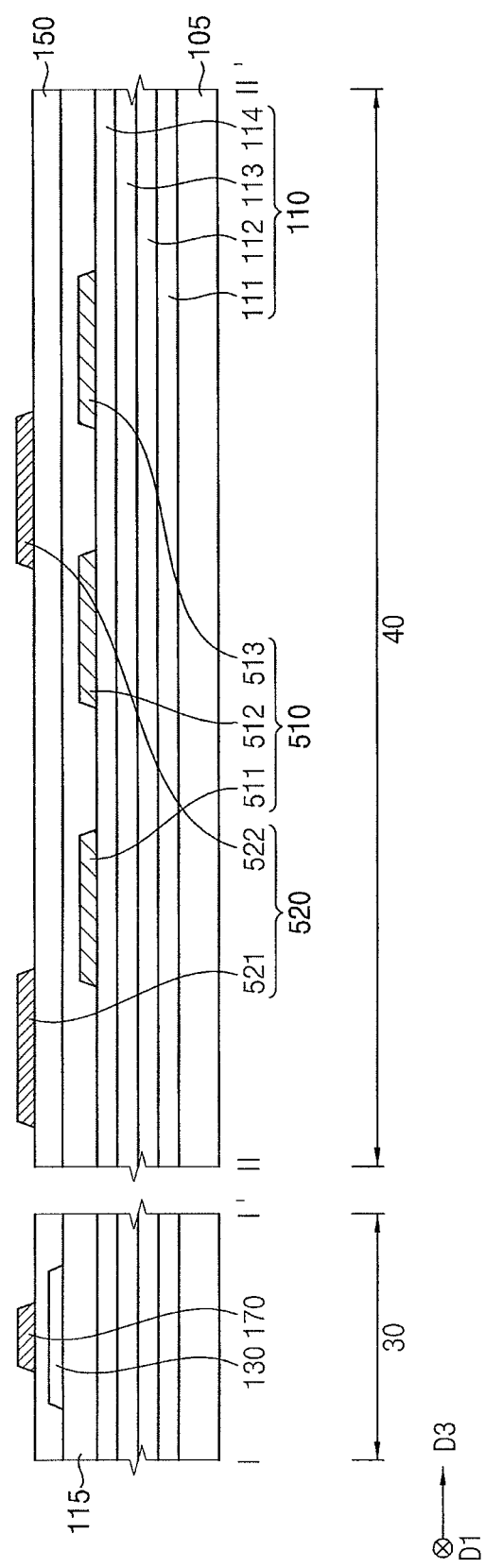
Figure 14:
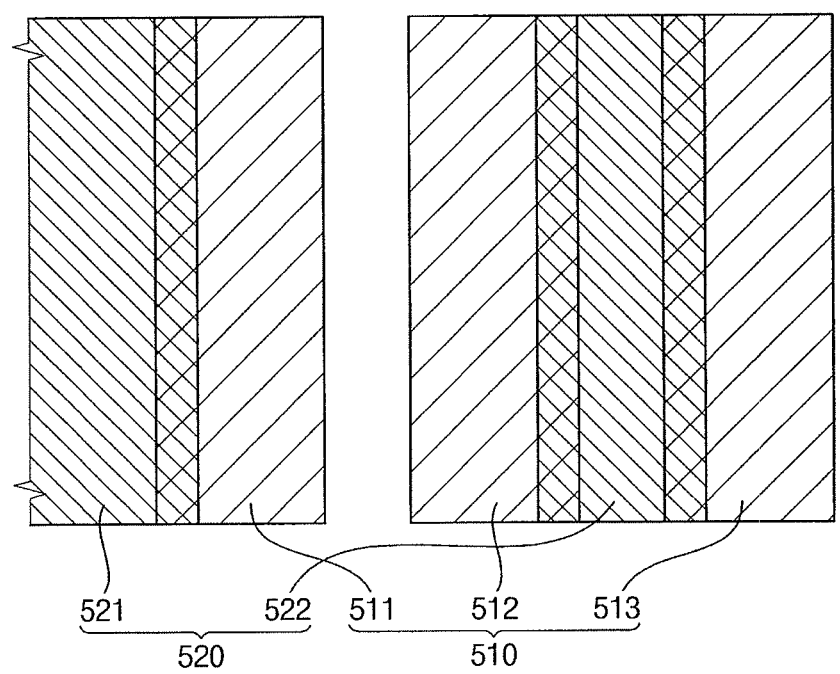
Figure 14:
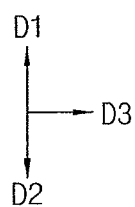
Figure 15:
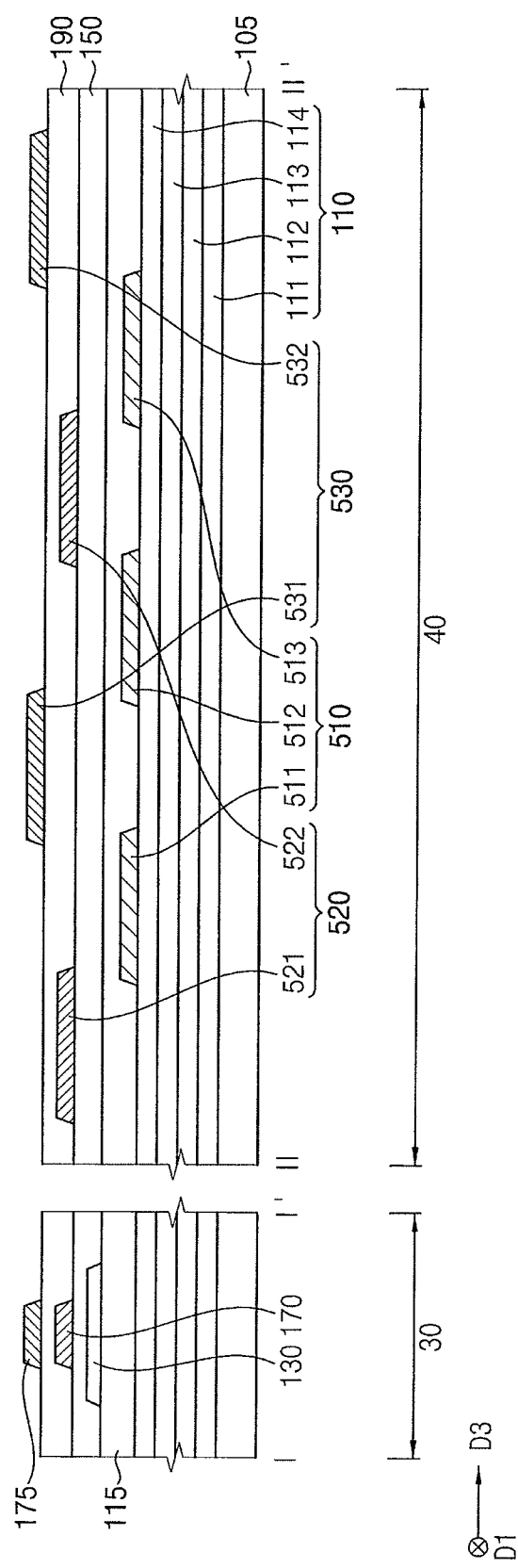
Figure 16:
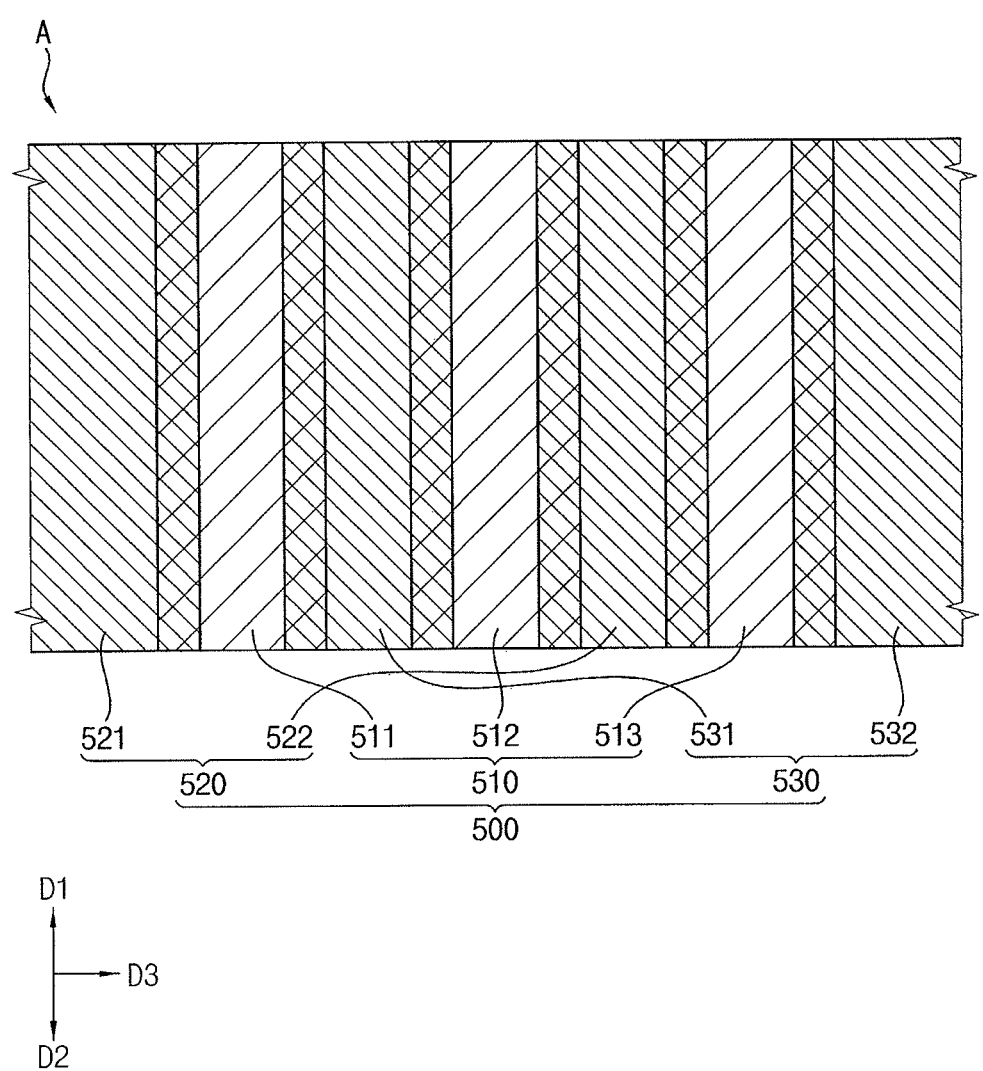

FIGS. 10 through 19 illustrate cross-sectional views depicting stages of a method of manufacturing an OLED display device in accordance with example embodiments. For example, FIG. 11 illustrates a plan view for describing a low fan-out wiring 510. FIG. 14 illustrates a plan view for describing a low fan-out wiring 510 and a middle fan-out wiring 520. FIG. 16 illustrates a plan view for describing a low fan-out wiring 510, a middle fan-out wiring 520, and an upper fan-out wiring 530.

Referring to FIGS. 10 and 11, a rigid glass substrate 105 may be provided. A substrate 110 including transparent or opaque insulation materials may be formed on the rigid glass substrate 105. The substrate 110 may be formed using a flexible transparent material such as a flexible transparent resin. In example embodiments, the substrate 110 may have a configuration where the first organic film layer 111, the first barrier layer 112, the second organic film layer 113, and the second barrier layer 114 are sequentially stacked. The first barrier layer 112 and the second barrier layer 114 each may be formed using inorganic materials such as silicon oxide. The first barrier layer 112 and the second barrier layer 114 may block moisture or water that could permeate through the first and second organic film layers 111 and 113. The first organic film layer 111 and the second organic film layer 113 each may be formed using organic materials such as a polyimide-based resin.

A low fan-out wiring 510 may be formed in a peripheral region 40 on the substrate 110. For example, the low fan-out wiring 510 may include a first low fan-out wiring 511, a second low fan-out wiring 512, and a third low fan-out wiring 513. The first low fan-out wiring 511, the second low fan-out wiring 512, and the third low fan-out wiring 513 may be spaced apart from each other by a predetermined distance. In example embodiments, the low fan-out wiring 510 may be in direct contact with the substrate 110. For example, the low fan-out wiring 510 may be in direct contact with the second barrier layer 114 of the substrate 110. The low fan-out wiring 510 may be formed using a metal, an alloy, metal nitride, conductive metal oxide, transparent conductive materials, etc. For example, the low fan-out wiring 510 may include Au, Ag, Al, Pt, Ni, Ti, Pd, Mg, Ca, Li, Cr, Ta, W, Cu, Mo, Sc, Nd, Ir, an alloy of aluminum, AlNx, an alloy of silver, WNx, an alloy of copper, an alloy of molybdenum, TiNx, CrNx, TaNx, SRO, ZnOx, ITO, SnOx, InOx, GaOx, IZO, etc. These may be used alone or in a suitable combination thereof. In some implementations, the low fan-out wiring 510 may be formed as a multi-layered structure including a plurality of layers.

Referring to FIG. 12, a buffer layer 115 may be formed on the substrate 110 and the low fan-out wiring 510. In example embodiments, the buffer layer 115 may cover the low fan-out wiring 510 on the substrate 110 in the peripheral region 40. The buffer layer 115 may be entirely formed in a light emitting region 30 and the peripheral region 40. For example, the buffer layer 115 may sufficiently cover the low fan-out wiring 510 on the substrate 110. The buffer layer 115 may have a substantially flat upper surface without a step around the low fan-out wiring 510. In some implementations, the buffer layer 115 may cover the low fan-out wiring 510 on the substrate 110 and may be formed with a substantially uniform thickness along a profile of the low fan-out wiring 510. According to a type of the substrate 110, at least two buffer layers 115 may be provided on the substrate 110. The buffer layer 115 may be formed using silicon compound, metal oxide, etc. For example, the buffer layer 115 may include SiOx, SiNx, SiOxNy, SiOxCy, SiCxNy, AlOx, AlNx, TaOx, HfOx, ZrOx, TiOx, etc. In some implementations, the buffer layer 115 may be omitted.

An active layer 130 may be formed on the buffer layer 115 in the light emitting region 30. The active layer 130 may be formed using an oxide semiconductor, an inorganic semiconductor, an organic semiconductor, etc.

Referring to FIGS. 13 and 14, a gate insulation layer 150 may be formed on the active layer 130. The gate insulation layer 150 may cover the active layer 130 on the buffer layer 115 in the light emitting region 30. The gate insulation layer 150 may extend in a direction from the light emitting region 30 into a pad region 60. For example, the gate insulation layer 150 may be entirely formed on the buffer layer 115 in the light emitting region 30 and the peripheral region 40. For example, the gate insulation layer 150 may sufficiently cover the active layer 130 on the buffer layer 115, and may have a substantially flat upper surface without a step around the active layer 130. In some implementations, the gate insulation layer 150 may cover the active layer 130 on the buffer layer 115. The gate insulation layer 150 may be formed with a substantially uniform thickness along a profile of the active layer 130. The gate insulation layer 150 may be formed using silicon compound, metal oxide, etc.

A first gate electrode 170 may be formed on the gate insulation layer 150 in the light emitting region 30. The first gate electrode 170 may be formed on a portion of the gate insulation layer 150 under which the active layer 130 is located. The first gate electrode 170 may be formed using a metal, a metal alloy, metal nitride, conductive metal oxide, transparent conductive materials, etc. These may be used alone or in a suitable combination thereof. In some example embodiments, the first gate electrode 170 may be formed as a multi-layered structure including a plurality of layers.

A middle fan-out wiring 520 may be formed on the gate insulation layer 150 in the peripheral region 40. The middle fan-out wiring 520 may overlap at least a portion of the low fan-out wiring 510. For example, the middle fan-out wiring 520 may include a first middle fan-out wiring 521 and a second middle fan-out wiring 522. The first middle fan-out wiring 521 and the second middle fan-out wiring 522 may be spaced apart from each other by a predetermined distance. In example embodiments, the first middle fan-out wiring 521 may overlap at least a portion of the first low fan-out wiring 511. For example, the first middle fan-out wiring 521 may overlap a first side portion of the first low fan-out wiring 511. In addition, the second middle fan-out wiring 522 may overlap at least a portion of the second low fan-out wiring 512 and at least a portion of the third low fan-out wiring 513. For example, the second middle fan-out wiring 522 may overlap a second side portion of the second low fan-out wiring 512 and a first side portion of the third low fan-out wiring 513. In example embodiments, the first gate electrode 170 and the middle fan-out wiring 520 may be located at a same layer and may be simultaneously formed using the same materials. For example, after a first preliminary electrode layer is formed on the entire gate insulation layer 150, the first gate electrode 170 and the middle fan-out wiring 520 may be formed by selectively etching the first preliminary electrode layer. The middle fan-out wiring 520 may be formed using a metal, an alloy, metal nitride, conductive metal oxide, transparent conductive materials, etc. These may be used alone or in a suitable combination thereof. In some implementations, the middle fan-out wiring 520 may be formed as a multi-layered structure including a plurality of layers.

Referring to FIGS. 15 and 16, a first insulating interlayer 190 may be formed on the first gate electrode 170 and the middle fan-out wiring 520. The first insulating interlayer 190 may cover the first gate electrode 170 in the light emitting region 30 on the gate insulation layer 150 and may extend in a direction from the light emitting region 30 into the pad region 60. In addition, the first insulating interlayer 190 may cover the middle fan-out wiring 520 in the peripheral region 40 on the gate insulation layer 150. For example, the first insulating interlayer 190 may be formed on the entire gate insulation layer 150. The first insulating interlayer 190 may sufficiently cover the first gate electrode 170 and the middle fan-out wiring 520 on the gate insulation layer 150, and may have a substantially flat upper surface without a step around the first gate electrode 170 and the middle fan-out wiring 520. In some implementations, the first insulating interlayer 190 may cover the first gate electrode 170 and the middle fan-out wiring 520 on the gate insulation layer 150 and may be formed with a substantially uniform thickness along a profile of the first gate electrode 170 and the middle fan-out wiring 520. The first insulating interlayer 190 may be formed using silicon compound, metal oxide, etc.

A second gate electrode 175 may be formed on the first insulating interlayer 190 in the light emitting region 30. The second gate electrode 175 may be formed on a portion of the first insulating interlayer 190 under which the first gate electrode 170 is located. The second gate electrode 175 may be formed using a metal, a metal alloy, metal nitride, conductive metal oxide, transparent conductive materials, etc. These may be used alone or in a suitable combination thereof. In some example embodiments, the second gate electrode 175 may be formed as a multi-layered structure including a plurality of layers.

An upper fan-out wiring 530 may be formed on the first insulating interlayer 190 in the peripheral region 40. The upper fan-out wiring 530 may overlap at least a portion of the low fan-out wiring 510. For example, the upper fan-out wiring 530 may include a first upper fan-out wiring 531 and a second upper fan-out wiring 532. The first upper fan-out wiring 531 and the second upper fan-out wiring 532 may be spaced apart from each other by a predetermined distance. In example embodiments, the first upper fan-out wiring 531 may overlap at least a portion of the first low fan-out wiring 511 and at least a portion of the second low fan-out wiring 512. For example, the first upper fan-out wiring 531 may overlap a second side portion of the first low fan-out wiring 511 and a first side portion of the second low fan-out wiring 512. In addition, the second upper fan-out wiring 532 may overlap at least a portion of the third low fan-out wiring 513. For example, the second upper fan-out wiring 532 may overlap a second side portion of the third low fan-out wiring 513. In example embodiments, the second gate electrode 175 and the upper fan-out wiring 530 may be located at a same layer and may be simultaneously formed using the same materials. For example, after a second preliminary electrode layer is formed on the entire first insulating interlayer 190, the second gate electrode 175 and the upper fan-out wiring 530 may be formed by selectively etching the second preliminary electrode layer. The upper fan-out wiring 530 may be formed using a metal, an alloy, metal nitride, conductive metal oxide, transparent conductive materials, etc. These may be used alone or in a suitable combination thereof. In some implementations, the upper fan-out wiring 530 may be formed as a multi-layered structure including a plurality of layers. Accordingly, a fan-out wirings 500 including the low fan-out wiring 510, the middle fan-out wiring 520, and the upper fan-out wiring 530 may be formed.

Figure 17:
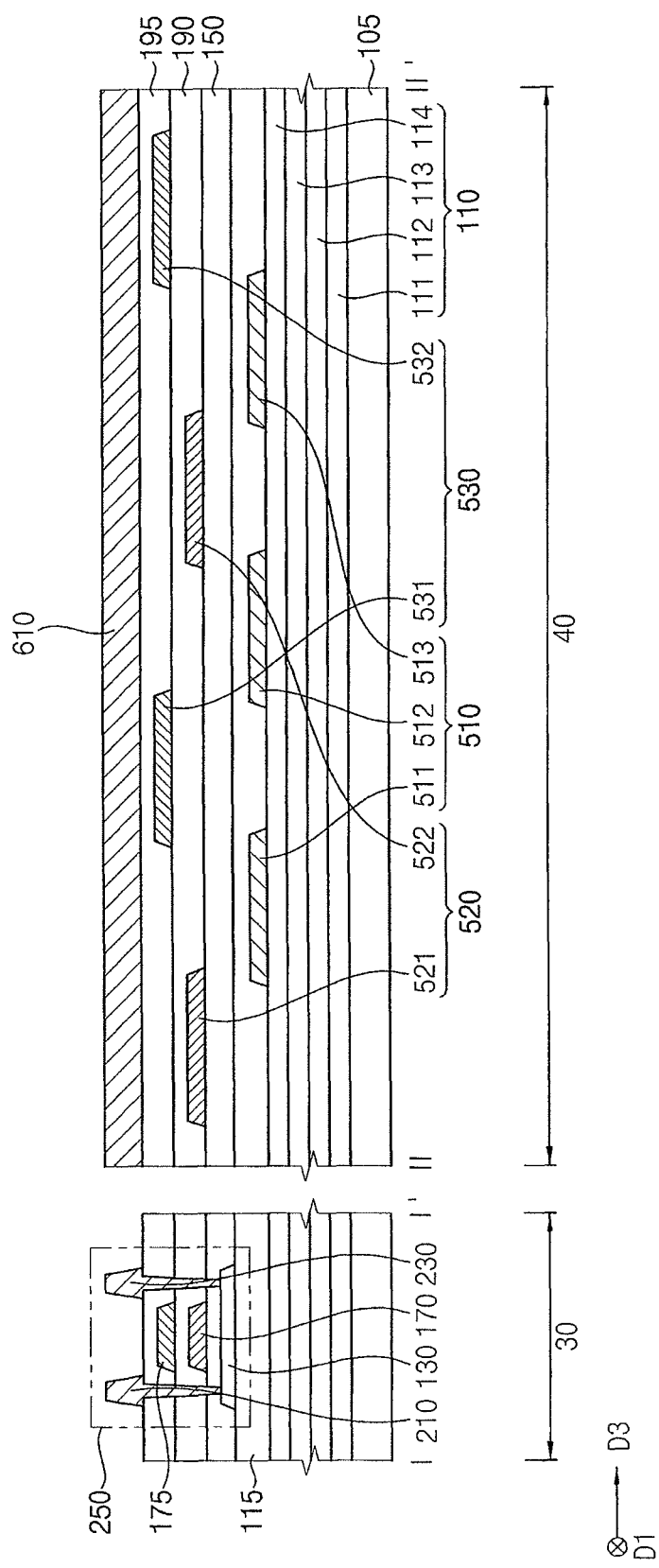

Referring to FIG. 17, a second insulating interlayer 195 may be formed on the second gate electrode 175 and the upper fan-out wiring 530. The second insulating interlayer 195 may cover the second gate electrode 175 on the first insulating interlayer 190 in the light emitting region 30. The second insulating interlayer 195 may extend in a direction from the light emitting region 30 into the pad region 60. In addition, the second insulating interlayer 195 may cover the upper fan-out wiring 530 on the first insulating interlayer 190 in the peripheral region 40. For example, the second insulating interlayer 195 may be formed on the entire first insulating interlayer 190. The second insulating interlayer 195 may sufficiently cover the second gate electrode 175 and the upper fan-out wiring 530 on the first insulating interlayer 190, and may have a substantially flat upper surface without a step around the second gate electrode 175 and the upper fan-out wiring 530. In some implementations, the second insulating interlayer 195 may cover the second gate electrode 175 and the upper fan-out wiring 530 on the first insulating interlayer 190. The second insulating interlayer 195 may be formed with a substantially uniform thickness along a profile of the second gate electrode 175 and the upper fan-out wiring 530. The second insulating interlayer 195 may be formed using a silicon compound, a metal oxide, etc.

A source electrode 210 and a drain electrode 230 may be formed on the second insulating interlayer 195 in the light emitting region 30. The source electrode 210 may be in direct contact with a source region of the active layer 130 via a contact hole formed by removing a first portion of the gate insulation layer 150, the first insulating interlayer 190, and the second insulating interlayer 195. The drain electrode 230 may be in direct contact with a drain region of the active layer 130 via a contact hole formed by removing a second portion of the gate insulation layer 150, the first insulating interlayer 190, and the second insulating interlayer 195. Each of the source electrode 210 and the drain electrode 230 may be formed using a metal, an alloy, metal nitride, conductive metal oxide, transparent conductive materials, etc. These may be used alone or in a suitable combination thereof. In some example embodiments, each of the source and drain electrodes 210 and 230 may be formed as a multi-layered structure including a plurality of layers. Accordingly, a semiconductor element 250 including the active layer 130, the gate insulation layer 150, the first gate electrode 170, the first insulating interlayer 190, the second gate electrode 175, the second insulating interlayer 195, the source electrode 210, and the drain electrode 230 may be formed.

A power supply wiring 610 may be formed on the second insulating interlayer 195 in the peripheral region 40. For example, the power supply wiring 610 may overlap the fan-out wirings 500. In example embodiments, the power supply wiring 610, the source electrode 210, and the drain electrode 230 may be located at a same layer and may be simultaneously formed using same materials. For example, after a third preliminary electrode layer is formed on the entire second insulating interlayer 195, the source electrode 210, the drain electrode 230, and the power supply wiring 610 may be formed by selectively etching the third preliminary electrode layer. The power supply wiring 610 may be formed using a metal, an alloy, metal nitride, conductive metal oxide, transparent conductive materials, etc. These may be used alone or in a suitable combination thereof. In some implementations, the power supply wiring 610 may be formed as a multi-layered structure including a plurality of layers.

Figure 18:
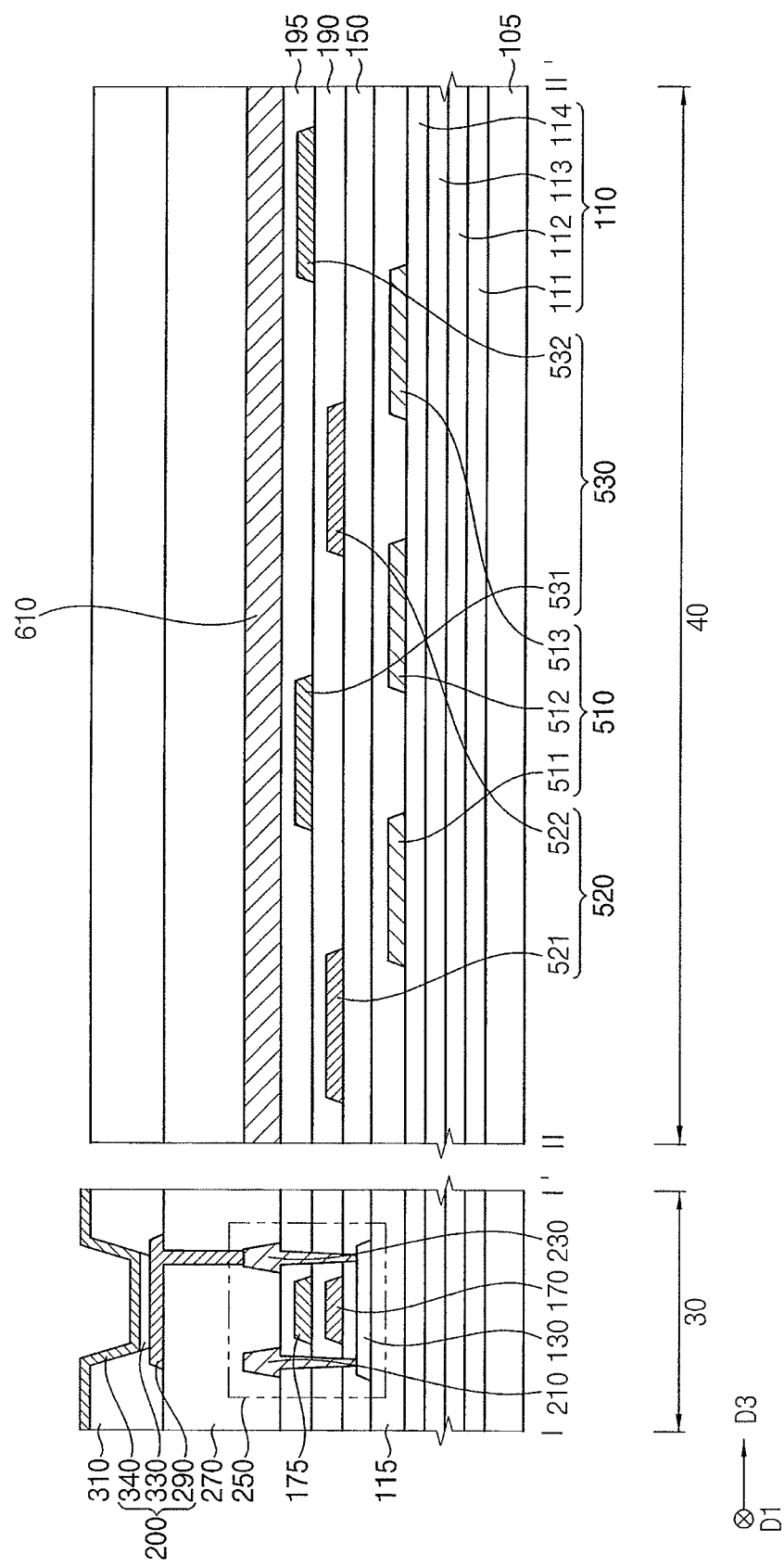

Referring to FIG. 18, a planarization layer 270 may be formed on the second insulating interlayer 195, the power supply wiring 610, the source electrode 210, and the drain electrode 230. The planarization layer 270 may cover the source and drain electrodes 210 and 230 on the second insulating interlayer 195 in the light emitting region 30, and may cover the power supply wiring 610 on the second insulating interlayer 195 in the peripheral region 40. For example, the planarization layer 270 may be formed with a high thickness in the light emitting region 30 and the peripheral region 40. In this case, the planarization layer 270 may have a substantially flat upper surface, and a planarization process may be further performed on the planarization layer 270 to implement the flat upper surface of the planarization layer 270. In some implementations, the planarization layer 270 may be formed with a substantially uniform thickness along a profile of the power supply wiring 610 and the source and drain electrodes 210 and 230 in the light emitting region 30 and the peripheral region 40 on the second insulating interlayer 195. The planarization layer 270 may include organic materials or inorganic materials. In example embodiments, the planarization layer 270 may be formed using organic materials such as a photoresist, a polyacryl-based resin, a polyimide-based resin, a polyamide-based resin, a siloxane-based resin, an acryl-based resin, or an epoxy-based resin, etc.

A lower electrode 290 may be formed on the planarization layer 270 in the light emitting region 30. The lower electrode 290 may be in contact with the drain electrode 230 via a contact hole formed by removing a portion of the planarization layer 270. The lower electrode 290 may be formed using a metal, a metal alloy, metal nitride, conductive metal oxide, transparent conductive materials, etc. These may be used alone or in a suitable combination thereof. In some example embodiments, the lower electrode 290 may be formed as a multi-layered structure including a plurality of layers.

A pixel defining layer 310 may be formed on the planarization layer 270 in the light emitting region 30. The pixel defining layer 310 may expose a portion of the lower electrode 290 and may extend in a direction from the light emitting region 30 into the pad region 60. For example, the pixel defining layer 310 may cover both lateral portions of the lower electrode 290 and extend in a direction from the light emitting region 30 into the pad region 60. The pixel defining layer 310 may be formed on the planarization layer 270 in the peripheral region 40. The pixel defining layer 310 may include organic materials or inorganic materials. In example embodiments, the pixel defining layer 310 may be formed using organic materials.

A light emitting layer 330 may be formed on a portion of the lower electrode 290 exposed by the pixel defining layer 310. The light emitting layer 330 may be formed using at least one of light emitting materials capable of generating different colors of light (e.g., a red light, a blue light, and a green light, etc.) according to sub-pixels. In some implementations, the light emitting layer 330 may generally generate a white light by stacking a plurality of light emitting materials capable of generating different colors of light such as a red light, a green light, a blue light, etc. In this case, a color filter may be formed on the light emitting layer 330. The color filter may include at least one selected from a red color filter, a green color filter, and a blue color filter. In some implementations, the color filter may include a yellow color filter, a cyan color filter, and a magenta color filter. The color filter may be formed using a photosensitive resin, a color photoresist, etc.

An upper electrode 340 may be formed on the pixel defining layer 310 and the light emitting layer 330 in the light emitting region 30. The upper electrode 340 may be formed using a metal, a metal alloy, metal nitride, conductive metal oxide, transparent conductive materials, etc. These may be used alone or in a suitable combination thereof. In some example embodiments, the upper electrode 340 may be formed as a multi-layered structure including a plurality of layers. Accordingly, a light emitting structure 200 including the lower electrode 290, the light emitting layer 330, and the upper electrode 340 may be formed.

Figure 19:
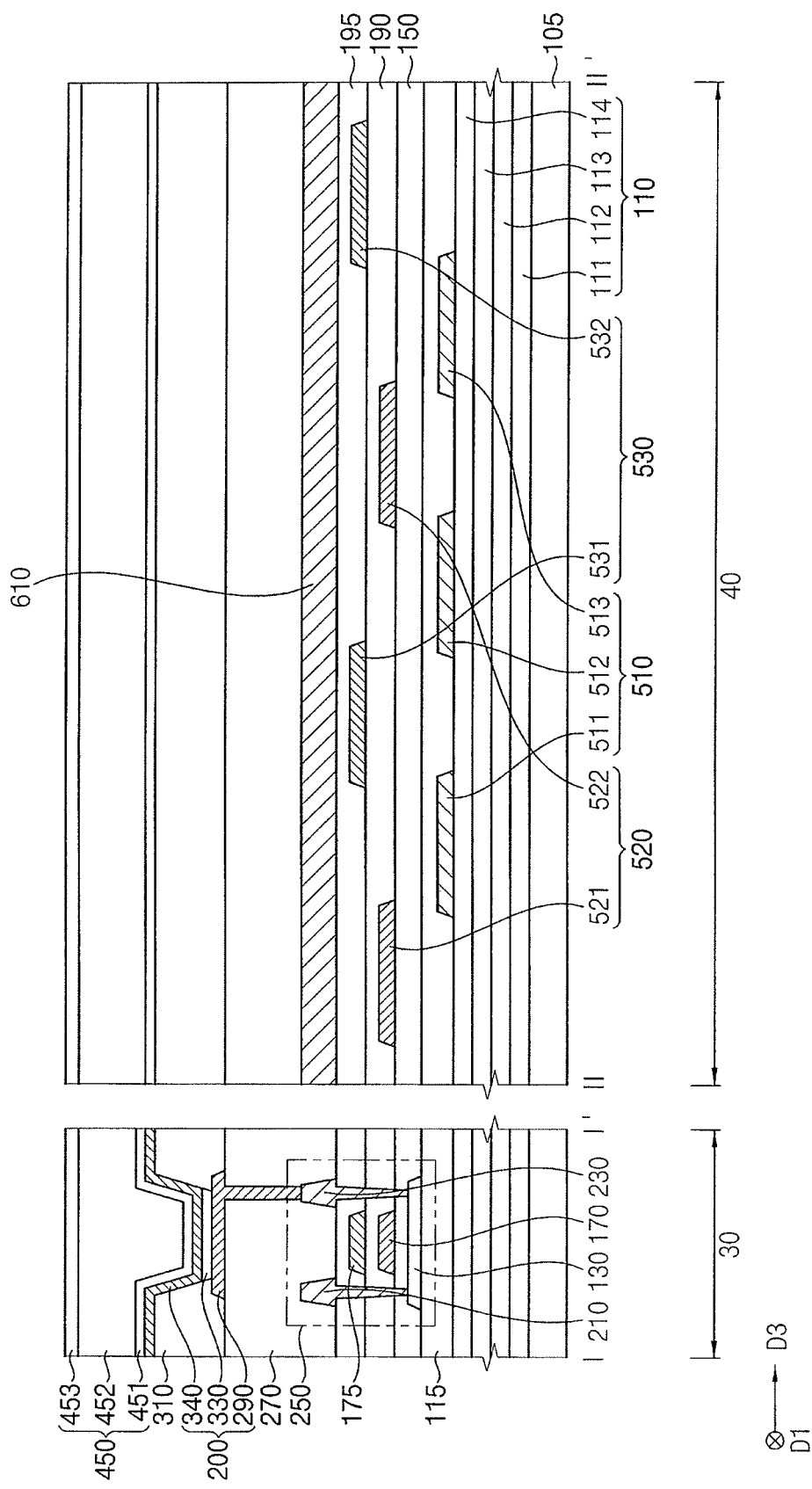

Referring to FIG. 19, a first TFE layer 451 may be formed on the upper electrode 340 in the light emitting region 30 and on the pixel defining layer 310 in the peripheral region 40. The first TFE layer 451 may cover the upper electrode 340 in the light emitting region 30. The first TFE layer 451 may be formed with a substantially uniform thickness along a profile of the upper electrode 340. In addition, the first TFE layer 451 may cover the pixel defining layer 310 in the peripheral region 40, and may be formed with a substantially uniform thickness along a profile of the pixel defining layer 310. The first TFE layer 451 may be formed using inorganic materials having flexibility.

A second TFE layer 452 may be formed in the light emitting region 30 and the peripheral region 40 on the first TFE layer 451. The second TFE layer 452 may be formed using organic materials having the flexibility.

A third TFE layer 453 may be formed in the light emitting region 30 and the peripheral region 40 on the second TFE layer 452. The third TFE layer 453 may cover the second TFE layer 452, and may be formed with a substantially uniform thickness along a profile of the second TFE layer 452. The third TFE layer 453 may be formed using inorganic materials having flexibility. A TFE structure 450 including the first TFE layer 451, the second TFE layer 452, and the third TFE layer 453 may be formed.

After the TFE structure 450 is formed, the rigid glass substrate 105 may be removed from the substrate 110. Accordingly, the OLED display device 100 illustrated in FIG. 8 may be manufactured.

Figure 20:
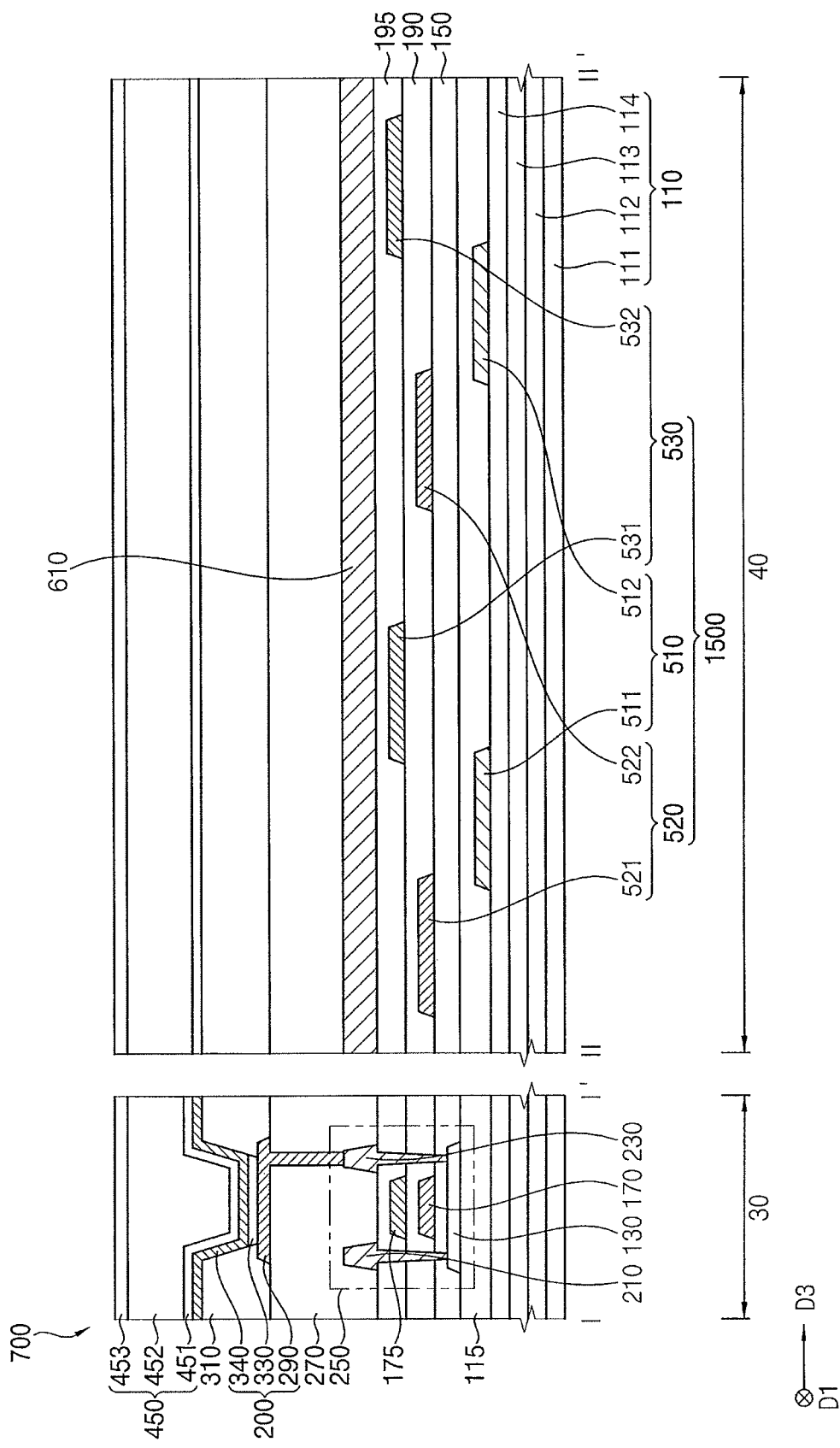
FIG. 20 illustrates a cross-sectional view of an OLED display device in accordance with example embodiments.

FIG. 20 illustrates a cross-sectional view of an OLED display device in accordance with example embodiments.

An OLED display device 700 illustrated in FIG. 20 may have a configuration substantially the same as or similar to that of an OLED display device 100 described with reference to FIGS. 1 through 9 except for the number and location of the fan-out wirings 1500. In FIG. 20, detailed descriptions for elements that are substantially the same as or similar to elements described with reference to FIGS. 1 through 9 may not be repeated.

Referring to FIG. 20, the OLED display device 700 may include a substrate 110, a buffer layer 115, a semiconductor element 250, a light emitting structure 200, fan-out wirings 1500, a power supply wiring 610, a planarization layer 270, a pixel defining layer 310, a TFE structure 450, etc. The fan-out wirings 1500 may include a low fan-out wiring 510, a middle fan-out wiring 520, and an upper fan-out wiring 530. The low fan-out wiring 510 may include a first low fan-out wiring 511 and a second low fan-out wiring 512, and the middle fan-out wiring 520 may include a first middle fan-out wiring 521 and a second middle fan-out wiring 522. The upper fan-out wiring 530 may include a first upper fan-out wiring 531 and a second upper fan-out wiring 532.

The low fan-out wiring 510 may be disposed on the substrate 110 in the peripheral region 40. As described above, the low fan-out wiring 510 may include the first low fan-out wiring 511 and the second low fan-out wiring 512. The first low fan-out wiring 511 and the second low fan-out wiring 512 may be spaced apart from each other by a predetermined distance. In example embodiments, the low fan-out wiring 510 may be in direct contact with the substrate 110. For example, the low fan-out wiring 510 may be in direct contact with the second barrier layer 114 of the substrate 110. A data signal may be applied to the low fan-out wiring 510.

The middle fan-out wiring 520 may be disposed on the gate insulation layer 150 in the peripheral region 40. The middle fan-out wiring 520 may overlap at least a portion of the low fan-out wiring 510. As described above, the middle fan-out wiring 520 may include the first middle fan-out wiring 521 and the second middle fan-out wiring 522. The first middle fan-out wiring 521 and the second middle fan-out wiring 522 may be spaced apart from each other by a predetermined distance. In example embodiments, the first middle fan-out wiring 521 may overlap at least a portion of the first low fan-out wiring 511. For example, the first middle fan-out wiring 521 may overlap a first side portion of the first low fan-out wiring 511. In addition, the second middle fan-out wiring 522 may overlap at least a portion of the second low fan-out wiring 512. For example, the second middle fan-out wiring 522 may overlap a first side portion of the second low fan-out wiring 512. A data signal may be applied to the middle fan-out wiring 520.

The upper fan-out wiring 530 may be disposed on the first insulating interlayer 190 in the peripheral region 40. The upper fan-out wiring 530 may overlap at least a portion of the low fan-out wiring 510. As described above, the upper fan-out wiring 530 may include the first upper fan-out wiring 531 and the second upper fan-out wiring 532. The first upper fan-out wiring 531 and the second upper fan-out wiring 532 may be spaced apart from each other by a predetermined distance. In example embodiments, the first upper fan-out wiring 531 may overlap at least a portion of the first low fan-out wiring 511. For example, the first upper fan-out wiring 531 may overlap a second side portion of the first low fan-out wiring 511. In addition, the second upper fan-out wiring 532 may overlap at least a portion of the second low fan-out wiring 512. For example, the second upper fan-out wiring 532 may overlap a second side portion of the second low fan-out wiring 512. A data signal may be applied to the upper fan-out wiring 530.

In example embodiments, the middle fan-out wiring 520, the low fan-out wiring 510, and the upper fan-out wiring 530 may be alternately and repeatedly arranged. For example, the first middle fan-out wiring 521, the first low fan-out wiring 511, and the first upper fan-out wiring 531 may be sequentially arranged along a third direction D3. The second middle fan-out wiring 522, the second low fan-out wiring 512, and the second upper fan-out wiring 532 may be sequentially arranged along the third direction D3.

Figure 21:
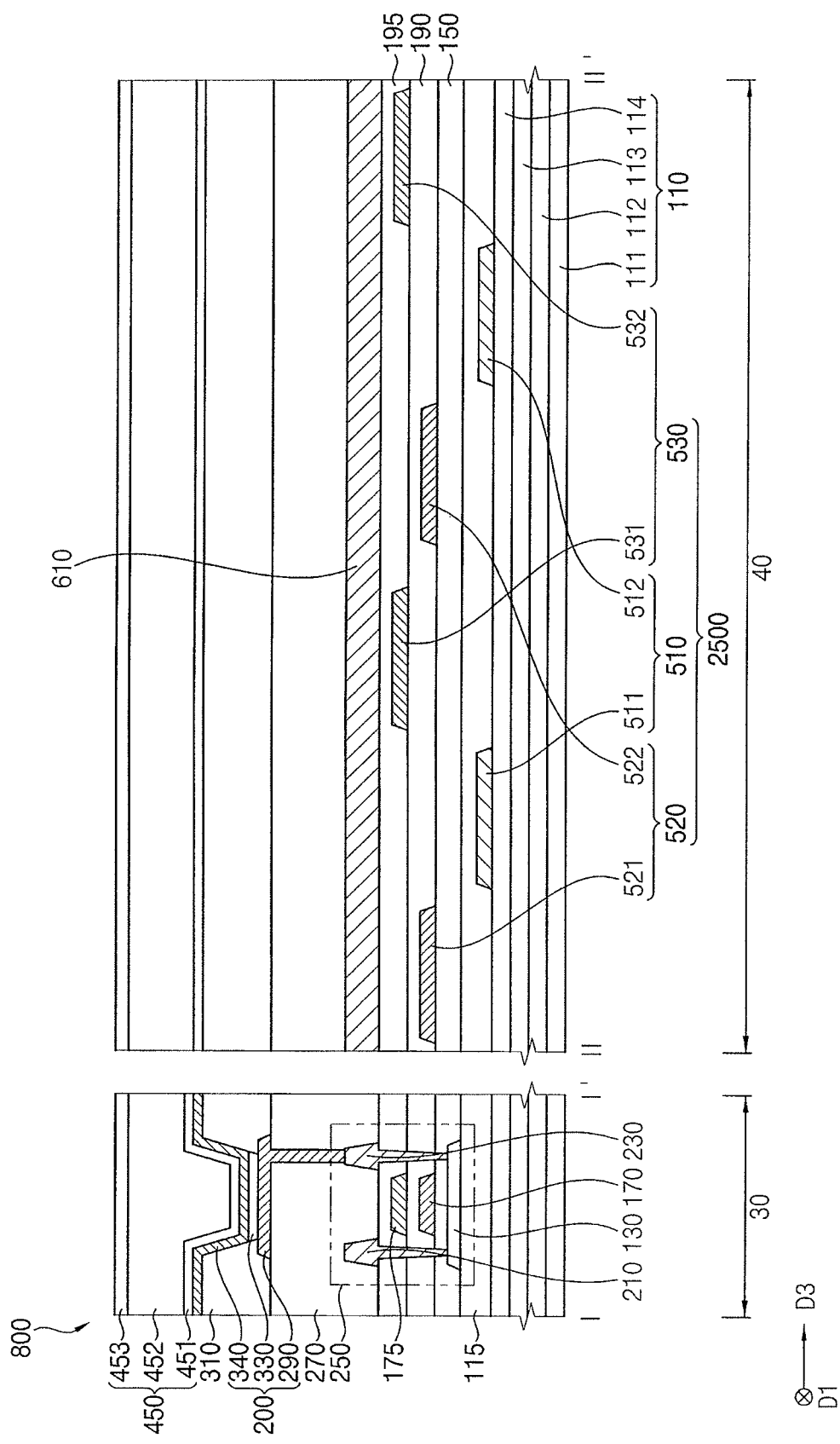
FIG. 21 illustrates a cross-sectional view of an OLED display device in accordance with example embodiments.

FIG. 21 illustrates a cross-sectional view of an OLED display device in accordance with example embodiments. An OLED display device 800 illustrated in FIG. 21 may have a configuration substantially the same as or similar to that of an OLED display device 700 described with reference to FIG. 20 except for the location of the fan-out wirings 2500. In FIG. 21, detailed descriptions for elements that are substantially the same as or similar to elements described with reference to FIG. 20 may not be repeated.

Referring to FIG. 21, the OLED display device 800 may include a substrate 110, a buffer layer 115, a semiconductor element 250, a light emitting structure 200, fan-out wirings 2500, a power supply wiring 610, a planarization layer 270, a pixel defining layer 310, a TFE structure 450, etc. The fan-out wirings 2500 may include a low fan-out wiring 510, a middle fan-out wiring 520, and an upper fan-out wiring 530. The low fan-out wiring 510 may include a first low fan-out wiring 511 and a second low fan-out wiring 512, and the middle fan-out wiring 520 may include a first middle fan-out wiring 521 and a second middle fan-out wiring 522. The upper fan-out wiring 530 may include a first upper fan-out wiring 531 and a second upper fan-out wiring 532.

The low fan-out wiring 510 may be disposed on the substrate 110 in the peripheral region 40. As described above, the low fan-out wiring 510 may include the first low fan-out wiring 511 and the second low fan-out wiring 512. The first low fan-out wiring 511 and the second low fan-out wiring 512 may be spaced apart from each other by a predetermined distance. In example embodiments, the low fan-out wiring 510 may be in direct contact with the substrate 110. For example, the low fan-out wiring 510 may be in direct contact with the second barrier layer 114 of the substrate 110. A data signal may be applied to the low fan-out wiring 510.

The middle fan-out wiring 520 may be disposed on the gate insulation layer 150 in the peripheral region 40. The middle fan-out wiring 520 may selectively overlap at least a portion of the low fan-out wiring 510. As described above, the middle fan-out wiring 520 may include the first middle fan-out wiring 521 and the second middle fan-out wiring 522. The first middle fan-out wiring 521 and the second middle fan-out wiring 522 may be spaced apart from each other by a predetermined distance. In example embodiments, the first middle fan-out wiring 521 might not overlap the first low fan-out wiring 511. In addition, the second middle fan-out wiring 522 may not overlap the second low fan-out wiring 512. A data signal may be applied to the middle fan-out wiring 520.

The upper fan-out wiring 530 may be disposed on the first insulating interlayer 190 in the peripheral region 40. The upper fan-out wiring 530 may selectively overlap at least a portion of the low fan-out wiring 510. As described above, the upper fan-out wiring 530 may include the first upper fan-out wiring 531 and the second upper fan-out wiring 532. The first upper fan-out wiring 531 and the second upper fan-out wiring 532 may be spaced apart from each other by a predetermined distance. In example embodiments, the first upper fan-out wiring 531 might not overlap the first low fan-out wiring 511. In addition, the second upper fan-out wiring 532 might not overlap the second low fan-out wiring 512. A data signal may be applied to the upper fan-out wiring 530.

In example embodiments, the middle fan-out wiring 520, the low fan-out wiring 510, and the upper fan-out wiring 530 may be alternately and repeatedly arranged. For example, the first middle fan-out wiring 521, the first low fan-out wiring 511, and the first upper fan-out wiring 531 may be sequentially arranged along a third direction D3, and the second middle fan-out wiring 522, the second low fan-out wiring 512, and the second upper fan-out wiring 532 may be sequentially arranged along the third direction D3.

Figure 22:
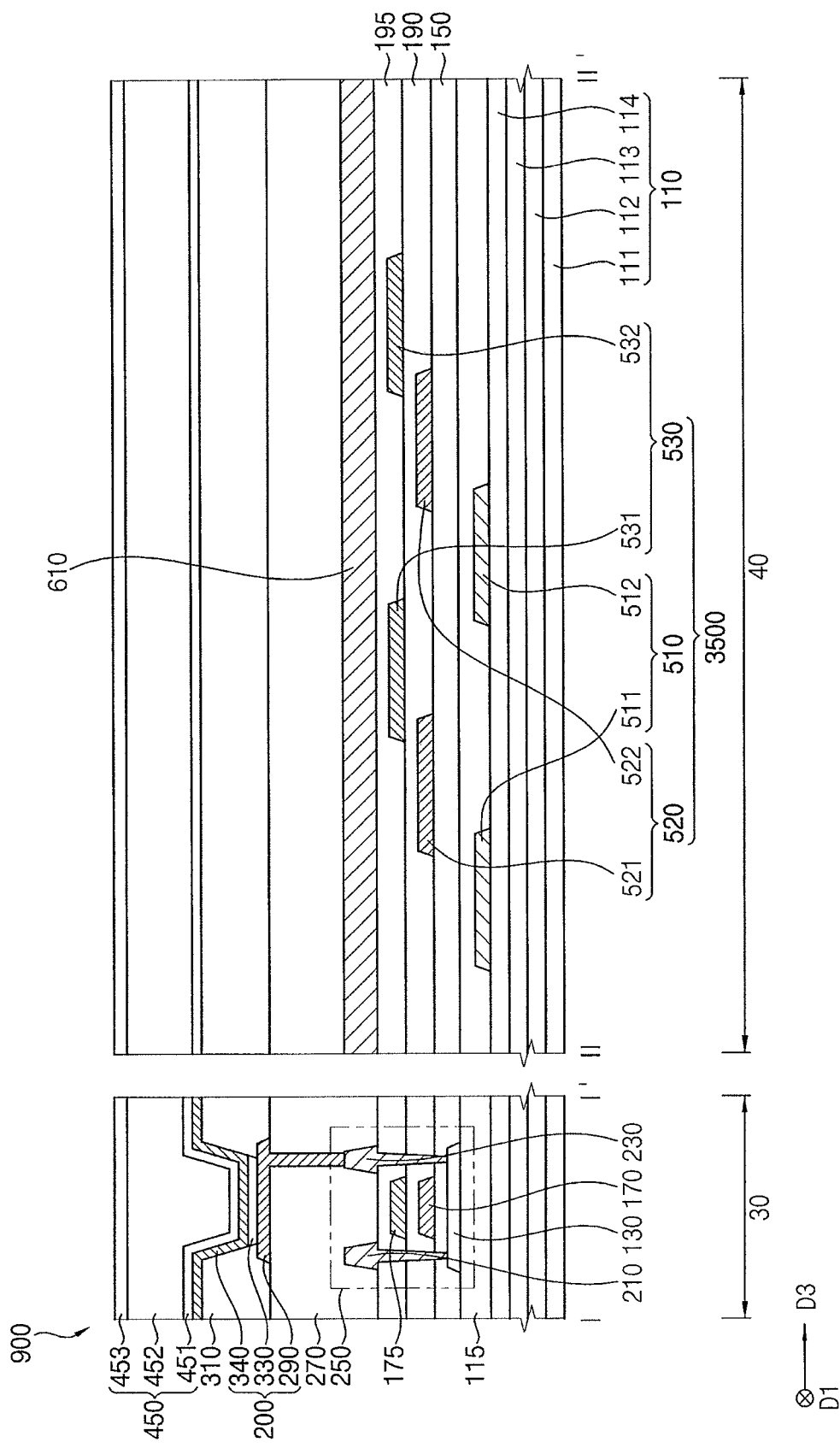
FIG. 22 illustrates a cross-sectional view of an OLED display device in accordance with example embodiments.

FIG. 22 illustrates a cross-sectional view illustrating an OLED display device in accordance with example embodiments. An OLED display device 900 illustrated in FIG. 22 may have a configuration substantially the same as or similar to that of an OLED display device 100 described with reference to FIGS. 1 through 9 except for the positioning of the fan-out wirings 3500. In FIG. 22, detailed descriptions for elements that are substantially the same as or similar to elements described with reference to FIGS. 1 through 9 may not be repeated.

Referring to FIG. 22, the OLED display device 900 may include a substrate 110, a buffer layer 115, a semiconductor element 250, a light emitting structure 200, fan-out wirings 3500, a power supply wiring 610, a planarization layer 270, a pixel defining layer 310, a TFE structure 450, etc. The fan-out wirings 3500 may include a low fan-out wiring 510, a middle fan-out wiring 520, and an upper fan-out wiring 530. The low fan-out wiring 510 may include a first low fan-out wiring 511 and a second low fan-out wiring 512, and the middle fan-out wiring 520 may include a first middle fan-out wiring 521 and a second middle fan-out wiring 522. The upper fan-out wiring 530 may include a first upper fan-out wiring 531 and a second upper fan-out wiring 532.

The low fan-out wiring 510 may be disposed on the substrate 110 in the peripheral region 40. As described above, the low fan-out wiring 510 may include the first low fan-out wiring 511 and the second low fan-out wiring 512. The first low fan-out wiring 511 and the second low fan-out wiring 512 may be spaced apart from each other by a predetermined distance. In example embodiments, the low fan-out wiring 510 may be in direct contact with the substrate 110. In other words, the low fan-out wiring 510 may be in direct contact with the second barrier layer 114 of the substrate 110. A data signal may be applied to the low fan-out wiring 510.

The middle fan-out wiring 520 may be disposed on the gate insulation layer 150 in the peripheral region 40. The middle fan-out wiring 520 may overlap at least a portion of the low fan-out wiring 510 and at least a portion of the upper fan-out wiring 530. As described above, the middle fan-out wiring 520 may include the first middle fan-out wiring 521 and the second middle fan-out wiring 522. The first middle fan-out wiring 521 and the second middle fan-out wiring 522 may be spaced apart from each other by a predetermined distance. In example embodiments, the first middle fan-out wiring 521 may overlap at least a portion of the first low fan-out wiring 511 and at least a portion of the first upper fan-out wiring 531. For example, a first side portion of the first middle fan-out wiring 521 may overlap a portion of the first low fan-out wiring 511, and a second side portion of the first middle fan-out wiring 521 may overlap a first side portion of the first upper fan-out wiring 531. In addition, the second middle fan-out wiring 522 may overlap at least a portion of the second low fan-out wiring 512 and at least a portion of the second upper fan-out wiring 532. For example, a first side portion of the second middle fan-out wiring 522 may overlap a portion of the second low fan-out wiring 512, and a second side portion of the second middle fan-out wiring 522 may overlap a first side portion of the second upper fan-out wiring 532. A data signal may be applied to the middle fan-out wiring 520.

The upper fan-out wiring 530 may be disposed on the first insulating interlayer 190 in the peripheral region 40. The upper fan-out wiring 530 may overlap at least a portion of the middle fan-out wiring 520 and at least a portion of the low fan-out wiring 510. As described above, the upper fan-out wiring 530 may include the first upper fan-out wiring 531 and the second upper fan-out wiring 532. The first upper fan-out wiring 531 and the second upper fan-out wiring 532 may be spaced apart from each other by a predetermined distance. In example embodiments, the first upper fan-out wiring 531 may overlap at least a portion of the first middle fan-out wiring 521 and at least a portion of the second low fan-out wiring 512. For example, the first upper fan-out wiring 531 may overlap a second side portion of the first middle fan-out wiring 521 and a first side portion of the second low fan-out wiring 512. In addition, the second upper fan-out wiring 532 may overlap at least a portion of the second middle fan-out wiring 522. For example, the second upper fan-out wiring 532 may overlap a second side portion of the second middle fan-out wiring 522. A data signal may be applied to the upper fan-out wiring 530.

In example embodiments, the low fan-out wiring 510, the middle fan-out wiring 520, and the upper fan-out wiring 530 may be alternately and repeatedly arranged. For example, the first low fan-out wiring 511, the first middle fan-out wiring 521, and the first upper fan-out wiring 531 may be sequentially arranged along a third direction D3, and the second low fan-out wiring 512, the second middle fan-out wiring 522, and the second upper fan-out wiring 532 may be sequentially arranged along the third direction D3.

By way of summation and review, an OLED display device may include a display region including a light emitting region and a peripheral region surrounding the light emitting region, and a pad region located at one side of the display region. A plurality of pads may be disposed in the pad region, and the OLED display device may receive a plurality of signals generated from an external device through the pads. The signals may be applied to a plurality of light emitting structures disposed in the light emitting region through a plurality of fan-out wirings that are disposed in the peripheral region located adjacent to the pad region. However, when a distance between the fan-out wirings is decreased to reduce a size of the peripheral region (e.g., a dead space), a short (or breaking or cutting, etc.) phenomenon of the fan-out wirings may occur. In addition, when a width of each of the fan-out wirings is decreased to prevent the short phenomenon, a defect of the OLED display device may occur because a wiring resistance of the fan-out wiring is increased.

The OLED display device according to example embodiments includes the fan-out wirings having a three-layer structure that includes a low fan-out wiring, a middle fan-out wiring, and an upper fan-out wiring. According to example embodiments, a short phenomenon between the fan-out wirings, or breaking or cutting of the fan-out wiring may be prevented or reduced, and a wiring resistance may be decreased. Accordingly, a wiring defect of the OLED display device may be reduced, and the dead space may be reduced.

Embodiments may be applied to various display devices including an OLED display device. For example, the present invention may be applied to vehicle-display device, a ship-display device, an aircraft-display device, portable communication devices, display devices for display or for information transfer, a medical-display device, etc.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. An organic light emitting diode ("OLED") display device, comprising:
   a substrate having a display region including a light emitting region and a peripheral region, and a pad region located in one side of the display region;
   a plurality of light emitting structures on the substrate in the light emitting region; and
   a plurality of fan-out wirings extending from the pad region including:
      a plurality of low fan-out wirings in the peripheral region on the substrate;
      a plurality of middle fan-out wirings on the low fan-out wiring, each middle fan-out wiring overlapping at least a portion of at least one low fan-out wiring; and
      a plurality of upper fan-out wirings on the middle fan-out wiring, each upper fan-out wiring overlapping at least a portion of at least one low fan-out wiring, wherein the upper fan-out wirings do not overlap the middle fan-out wirings.

2. The OLED display device as claimed in claim 1, wherein the fan-out wirings are in a portion of the peripheral region between the light emitting region and the pad region.

3. The OLED display device as claimed in claim 1, wherein each of the fan-out wirings includes a straight line portion and an oblique line portion.

4. The OLED display device as claimed in claim 3, wherein the straight line portion of each of the fan-out wirings extends in a first direction from the pad region into the display region, and the oblique line portion of each of the fan-out wirings extends in a direction that is different from the first direction.

5. The OLED display device as claimed in claim 3, wherein the straight line portion and the oblique line portion are integrally formed.

6. The OLED display device as claimed in claim 3, wherein the oblique line portion has a first distal end connected to the straight line portion and a second distal end aligned in one side of the light emitting region.

7. The OLED display device as claimed in claim 1, wherein the low, middle, and upper fan-out wirings are located at different layers from each other.

8. The OLED display device as claimed in claim 1, wherein
   a first side portion of the at least one low fan-out wiring overlaps at least one middle fan-out wiring,
   a second side portion of at least one low fan-out wiring overlaps at least one upper fan-out wiring, and
   the first side portion is opposite to the second side portion.

9. The OLED display device as claimed in claim 1, further comprising:
   a power supply wiring on the fan-out wirings.

10. The OLED display device as claimed in claim 1, wherein:
    the fan-out wirings include first through (N)th fan-out wirings, where N is a multiple of 4,
    a (4K+1)th fan-out wiring among the first through (N)th fan-out wirings corresponds to the middle fan-out wiring,
    (4K+2)th and (4K+4)th fan-out wirings among the first through (N)th fan-out wirings correspond to the low fan-out wirings, and
    a (4K+3)th fan-out wiring among the first through (N)th fan-out wirings corresponds to the upper fan-out wiring, where K is an integer between 0 and (N/4)−1, and wherein
    the (4K+1)th fan-out wiring overlaps a first side portion of the (4K+2)th fan-out wiring, and the (4K+3)th fan-out wiring overlaps a second side portion of the (4K+2)th fan-out wiring and a first side portion of the (4K+4)th fan-out wiring.

11. The OLED display device as claimed in claim 1, wherein the pad region includes:
    a bending region adjacent to the display region; and
    a pad electrode region spaced apart from the display region.

12. The OLED display device as claimed in claim 11, further comprising:
    a plurality of pad electrodes in the pad electrode region, the pad electrodes being electrically connected to an external device; and
    connection electrodes in the bending region, the connection electrodes electrically connecting the fan-out wirings and the pad electrodes.

13. The OLED display device as claimed in claim 1, further comprising:
    a buffer layer on the substrate, the buffer layer covering the low fan-out wirings in the peripheral region; and
    a plurality of semiconductor elements between the buffer layer and the light emitting structures.

14. The OLED display device as claimed in claim 13, wherein each of the semiconductor elements includes:
    an active layer on the buffer layer;
    a gate insulation layer covering the active layer on the buffer layer;
    a first gate electrode on the gate insulation layer;
    a first insulating interlayer covering the first gate electrode and the middle fan-out wiring on the gate insulation layer;
    a second gate electrode on the first insulating interlayer;
    a second insulating interlayer covering the second gate electrode and the upper fan-out wiring on the first insulating interlayer; and
    source and drain electrodes on the second insulating interlayer.

15. The OLED display device as claimed in claim 1, further comprising:
    a thin film encapsulation structure on the light emitting structures, wherein each of the light emitting structures includes:
   a lower electrode;
   a light emitting layer on the lower electrode; and
   an upper electrode on the light emitting layer, and wherein
the thin film encapsulation structure includes:
   a first thin film encapsulation layer on the upper electrode, the first thin film encapsulation layer including inorganic materials having flexibility;
   a second thin film encapsulation layer on the first thin film encapsulation layer, the second thin film encapsulation layer including organic materials having flexibility; and
   a third thin film encapsulation layer on the second thin film encapsulation layer, the third thin film encapsulation layer including the inorganic materials having the flexibility.

16. The OLED display device as claimed in claim 1, wherein at least one middle fan-out wiring overlaps two immediately adjacent low fan-out wirings.

17. The OLED display device as claimed in claim 1, wherein immediately adjacent low fan-out wirings are spaced apart at a different distance than immediately adjacent middle fan-out wirings.

18. The OLED display device as claimed in claim 17, wherein immediately adjacent low fan-out wirings are spaced apart at a different distance than immediately adjacent upper fan-out wirings.

19. The OLED display device as claimed in claim 1, wherein a first distance along a line perpendicular to a main plan of the substrate between the low fan-out wirings and the middle fan-out wirings is greater than a second distance along a line perpendicular to the main plan of the substrate between the middle fan-out wirings and the upper fan-out wirings.

20. An organic light emitting diode ("OLED") display device, comprising:
   a substrate having a display region including a light emitting region and a peripheral region, and a pad region located in one side of the display region;
   a plurality of light emitting structures on the substrate in the light emitting region;
   a plurality of fan-out wirings including:
      a low fan-out wiring in the peripheral region on the substrate;
      a middle fan-out wiring on the low fan-out wiring, the middle fan-out wiring overlapping at least a portion of the low fan-out wiring; and
      an upper fan-out wiring on the middle fan-out wiring, the upper fan-out wiring overlapping at least a portion of the low fan-out wiring, wherein
   the substrate includes:
      a first organic film layer;
      a first barrier layer on the first organic film layer;
      a second organic film layer on the first barrier layer; and
      a second barrier layer on the second organic film layer.

21. The OLED display device as claimed in claim 20, wherein the low fan-out wiring directly contacts the second barrier layer.

22. An OLED display device, comprising:
   a substrate having a display region including a light emitting region and a peripheral region and a pad region located in one side of the display region;
   a buffer layer on the substrate;
   a plurality of light emitting structures in the light emitting region on the buffer layer; and
   a plurality of fan-out wirings on the substrate in a portion of the peripheral region between the light emitting region and the pad region, the fan-out wirings including:
      a low fan-out wiring between the buffer layer and the substrate;
      a middle fan-out wiring on the low fan-out wiring, the middle fan-out wiring selectively overlapping at least a portion of the low fan-out wiring; and
      an upper fan-out wiring on the middle fan-out wiring, the upper fan-out wiring selectively overlapping at least a portion of the low fan-out wiring while not overlapping the middle fan-out wiring.

23. The OLED display device as claimed in claim 22, wherein the substrate includes:
   a first organic film layer;
   a first barrier layer disposed on the first organic film layer;
   a second organic film layer disposed on the first barrier layer; and
   a second barrier layer disposed on the second organic film layer.

24. The OLED display device as claimed in claim 22, wherein:
   each of the fan-out wirings includes a straight line portion and an oblique line portion,
   the straight line portion of each of the fan-out wirings extends in a first direction from the pad region into the display region,
   the oblique line portion of each of the fan-out wirings extends in a direction that is different from the first direction, and
   the middle, low, and upper fan-out wirings are alternately disposed.

* * * * *